US012588491B2

(12) United States Patent
Chen et al.

(10) Patent No.: US 12,588,491 B2
(45) Date of Patent: Mar. 24, 2026

(54) POWER RAIL AND SIGNAL LINE ARRANGEMENT IN INTEGRATED CIRCUITS HAVING STACKED TRANSISTORS

(71) Applicant: TAIWAN SEMICONDUCTOR MANUFACTURING COMPANY, LTD., Hsinchu (TW)

(72) Inventors: Chih-Liang Chen, Hsinchu (TW); Guo-Huei Wu, Hsinchu (TW); Ching-Wei Tsai, Hsinchu (TW); Shang-Wen Chang, Hsinchu (TW); Li-Chun Tien, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/361,666

(22) Filed: Jul. 28, 2023

(65) Prior Publication Data

US 2023/0387013 A1    Nov. 30, 2023

Related U.S. Application Data

(63) Continuation of application No. 17/390,177, filed on Jul. 30, 2021, now Pat. No. 11,764,154.

(51) Int. Cl.
H01L 23/528 (2006.01)
H10D 62/10 (2025.01)
(Continued)

(52) U.S. Cl.
CPC ....... H01L 23/5286 (2013.01); H10D 62/118 (2025.01); H10D 62/119 (2025.01);
(Continued)

(58) Field of Classification Search
CPC ......... H01L 23/49822; H01L 23/49827; H01L 23/49816; H01L 23/52; H01L 23/5226;
(Continued)

(56) References Cited

U.S. PATENT DOCUMENTS 7,260,442 B2    8/2007   Hwang et al.
9,256,709 B2    2/2016   Yu et al.
(Continued)

FOREIGN PATENT DOCUMENTS

KR    10-2020-0037107    4/2020
KR    10-2020-0085897    7/2020

*Primary Examiner* — Natalia A Gondarenko
(74) *Attorney, Agent, or Firm* — Hauptman Ham, LLP

(57)    ABSTRACT

An integrated circuit device includes a first-type transistor having a channel region in a first-type active-region semiconductor structure and a second-type transistor having a channel region in a second-type active-region semiconductor structure which is stacked with the first-type active-region semiconductor structure. In the integrated circuit, a front-side power rail and a front-side signal line in a front-side conductive layer extend in the first direction is, and a back-side power rail and a back-side signal line in a back-side conductive layer also extend in the first direction. The front-side conductive layer is above the first-type active-region semiconductor structure and the second-type active-region semiconductor structure, while the back-side conductive layer is below the first-type active-region semiconductor structure and the second-type active-region semiconductor structure.

20 Claims, 39 Drawing Sheets

(51) Int. Cl.
| | |
|---|---|
| *H10D 84/01* | (2025.01) |
| *H10D 84/03* | (2025.01) |
| *H10D 84/83* | (2025.01) |

(52) U.S. Cl.
CPC ....... *H10D 84/0149* (2025.01); *H10D 84/038* (2025.01); *H10D 84/83* (2025.01)

(58) Field of Classification Search
CPC .............. H01L 23/535; H01L 23/5286; H01L 23/5283; H01L 23/5386; H01L 21/823475; H01L 21/76877; H01L 21/743; H01L 21/31144; H01L 21/4853; H01L 21/8221; H01L 21/823871; H01L 21/823821; H01L 29/0692; H01L 29/0696; H01L 29/401; H01L 29/4175; H01L 29/0673; H01L 29/66439; H01L 29/775; H01L 29/0665; H01L 29/0669; H01L 27/088; H01L 27/11803; H01L 27/10802; H01L 27/11898; H01L 27/0924; H01L 27/0922; H01L 27/0688; H01L 27/092; H01L 25/50; H01L 25/0657; H01L 25/07; H01L 25/074; G06F 17/50; G06F 17/5081; G06F 17/5068; G06F 17/5077; H10B 10/12; B82Y 10/00; H10D 62/118; H10D 62/119; H10D 84/0149; H10D 84/0137; H10D 84/038; H10D 84/83; H10D 84/0188; H10D 84/135; H10D 84/201; H10D 30/689; H10D 84/0186; H10D 84/85; H10D 84/0193; H10D 84/853; H10D 84/856; H10D 62/121; H10D 30/014; H10D 30/43; H10D 88/00; H10D 88/01; H10D 84/0135; H10D 84/0165; H10D 84/0158; H10D 84/961; H10D 84/966; H10H 20/826; H10H 20/851
USPC .......................................... 257/666, 40, 401
See application file for complete search history.

(56) References Cited

U.S. PATENT DOCUMENTS

| | | | | |
|---|---|---|---|---|
| 10,607,938 B1 * | 3/2020 | Rubin | ................. | H01L 27/1211 |
| 10,833,078 B2 | 11/2020 | Smith et al. | | |
| 11,764,154 B2 * | 9/2023 | Chen | ..................... | H01L 27/088 |
| | | | | 257/401 |
| 2014/0040838 A1 | 2/2014 | Liu et al. | | |
| 2015/0278429 A1 | 10/2015 | Chang | | |
| 2016/0043083 A1 | 2/2016 | Kawa et al. | | |
| 2017/0103986 A1 | 4/2017 | Kim et al. | | |
| 2018/0315838 A1 | 11/2018 | Morrow et al. | | |
| 2019/0172828 A1 | 6/2019 | Smith et al. | | |
| 2020/0135718 A1 * | 4/2020 | Liebmann | .............. | H10B 10/18 |
| 2020/0211905 A1 | 7/2020 | Huang et al. | | |
| 2020/0235013 A1 | 7/2020 | Lilak et al. | | |
| 2020/0328212 A1 | 10/2020 | Wu et al. | | |
| 2020/0343241 A1 | 10/2020 | Wu | | |
| 2021/0407999 A1 * | 12/2021 | Huang | ................. | H10D 62/121 |
| 2022/0059449 A1 * | 2/2022 | Do | .......................... | H10D 84/85 |
| 2022/0077147 A1 * | 3/2022 | Shih | .................... | H01L 23/5286 |
| 2022/0102380 A1 | 3/2022 | Chanemougame | | |
| 2022/0262785 A1 | 8/2022 | Yu | | |
| 2022/0271033 A1 | 8/2022 | Chanemougame et al. | | |
| 2022/0406717 A1 | 12/2022 | Lanzillo | | |
| 2023/0354571 A1 * | 11/2023 | Mathur | ................. | G11C 5/063 |

* cited by examiner

100

140F

120F

30F

VG

VT

132p

PMOS

50p

132n

NMOS

50n

30B

VB

120B

140B

134p

VMD

VBT

134n

150

Z

X

Y

200

140F

120F

30F

134p

VMD

134n

VB

VG

150

VT

PMOS

132p

50p

NMOS

132n

50n

30B

VB

120B

140B

300

140F

120F

30F

134p

VBT

134n

150

VT

VG

VT

132p

PMOS

50p

132n

NMOS

50n

30B

VB

120B

140B

Z

Y

X

400

30F

VT

VG

120F

140F

134p

132p

PMOS

50p

132n

NMOS

50n

30B

VB

134n

VB

150

VTB

120B

140B

600

140F

120F

30F

VT

VT

PMOS

132p

50p

132n

NMOS

50n

30B

VB

120B

140B

VTB

VG

150

VB

134n

134p

800

30F

VT

VG

120F

140F

132p

PMOS

50p

134p

150p

815

132n

NMOS

50n

30B

VB

134n

VB

150n

VG

VTB

120B

140B

| PMOS | pB2 | pB1 | pA1 | pA2 |
|------|-----|-----|-----|-----|
| NMOS | nB2 | nB1 | nA1 | nA2 |

FIG. 9C

| | | | | | | | | | | |
|---|---|---|---|---|---|---|---|---|---|---|
| PMOS | pQB | pSL_a | CPODE | pSE_0 | pSL_bx | pCK_SL | pCKb_TX | pML_ax | pCP |
| | pSI | pSEB | pD | pSE | CPODE | pCK_MX | pCKb_ML | pML_b | pCKb_0 |
| NMOS | nQB | nSL_a | CPODE | nSE_0 | nSL_bx | nCK_SL | nCKb_TX | nML_ax | nCP |
| | nSI | nSEB | nD | nSE | CPODE | nCK_MX | nCKb_ML | nML_b | nCKb_0 |

FIG. 10C

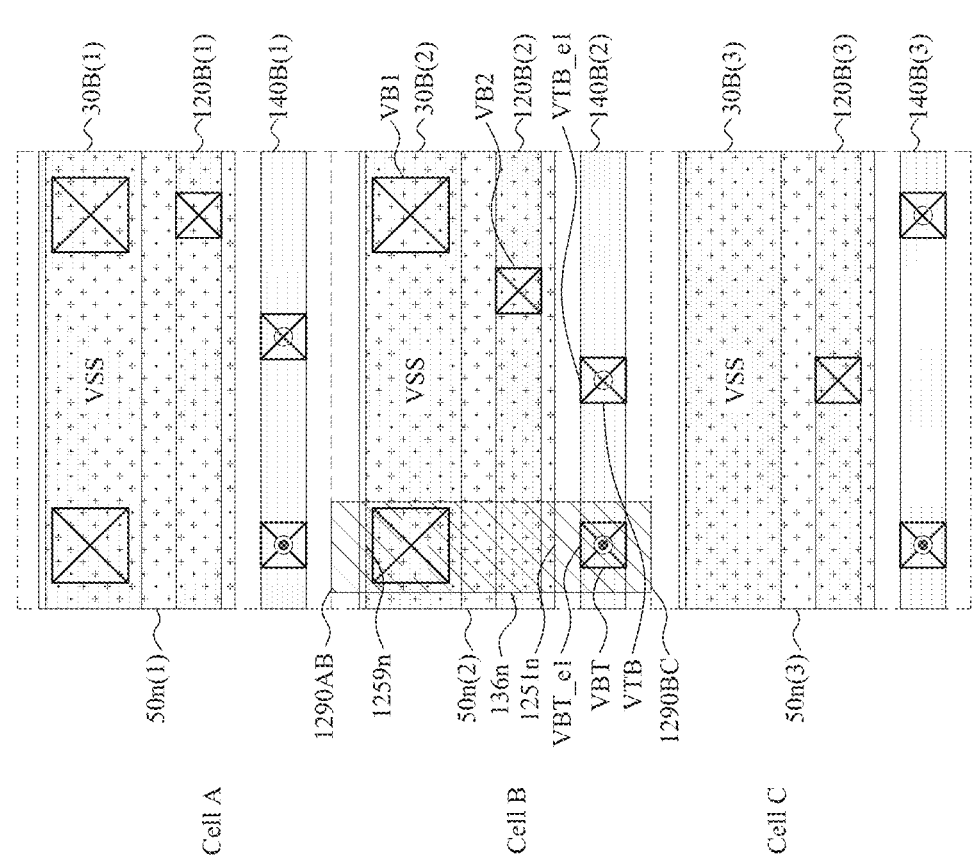
FIG. 12B

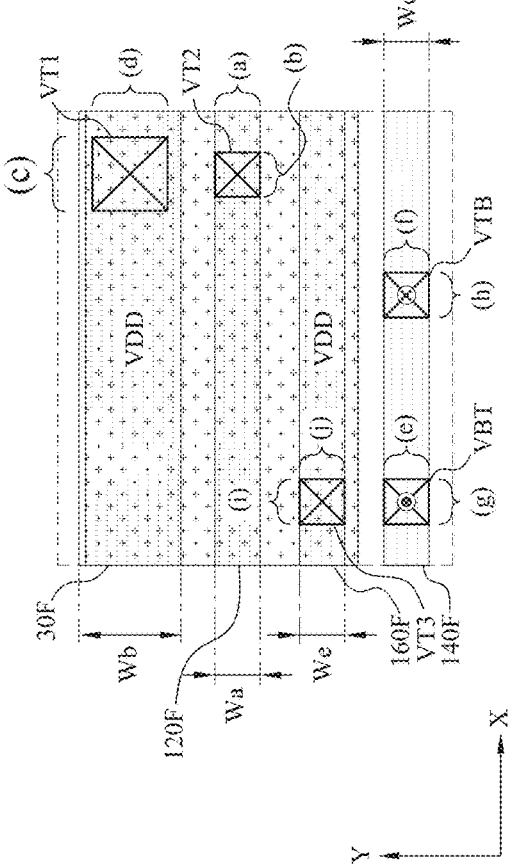
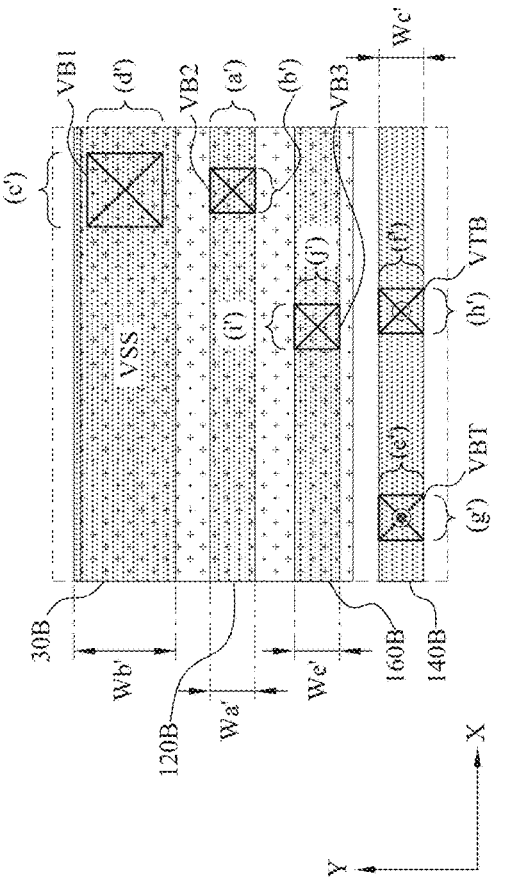
FIG. 13

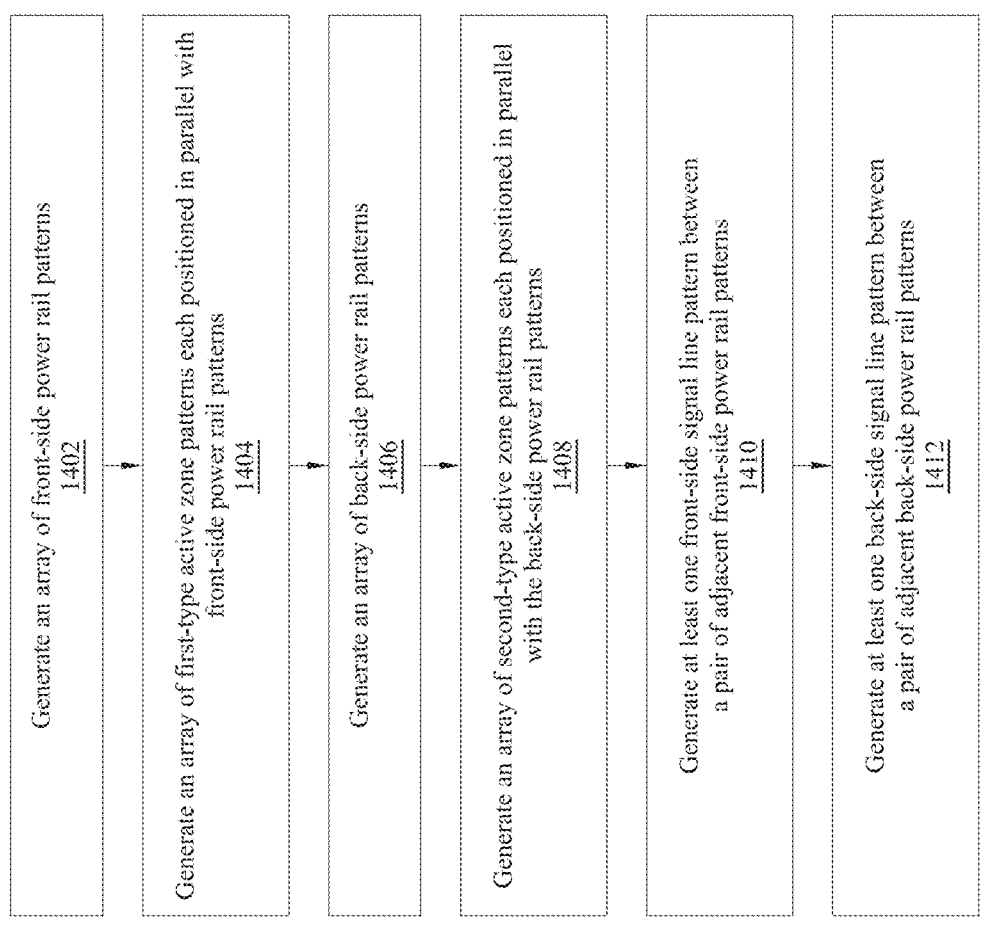

Generate an array of front-side power rail patterns
1402

Generate an array of first-type active zone patterns each positioned in parallel with front-side power rail patterns
1404

Generate an array of back-side power rail patterns
1406

Generate an array of second-type active zone patterns each positioned in parallel with the back-side power rail patterns
1408

Generate at least one front-side signal line pattern between a pair of adjacent front-side power rail patterns
1410

Generate at least one back-side signal line pattern between a pair of adjacent back-side power rail patterns
1412

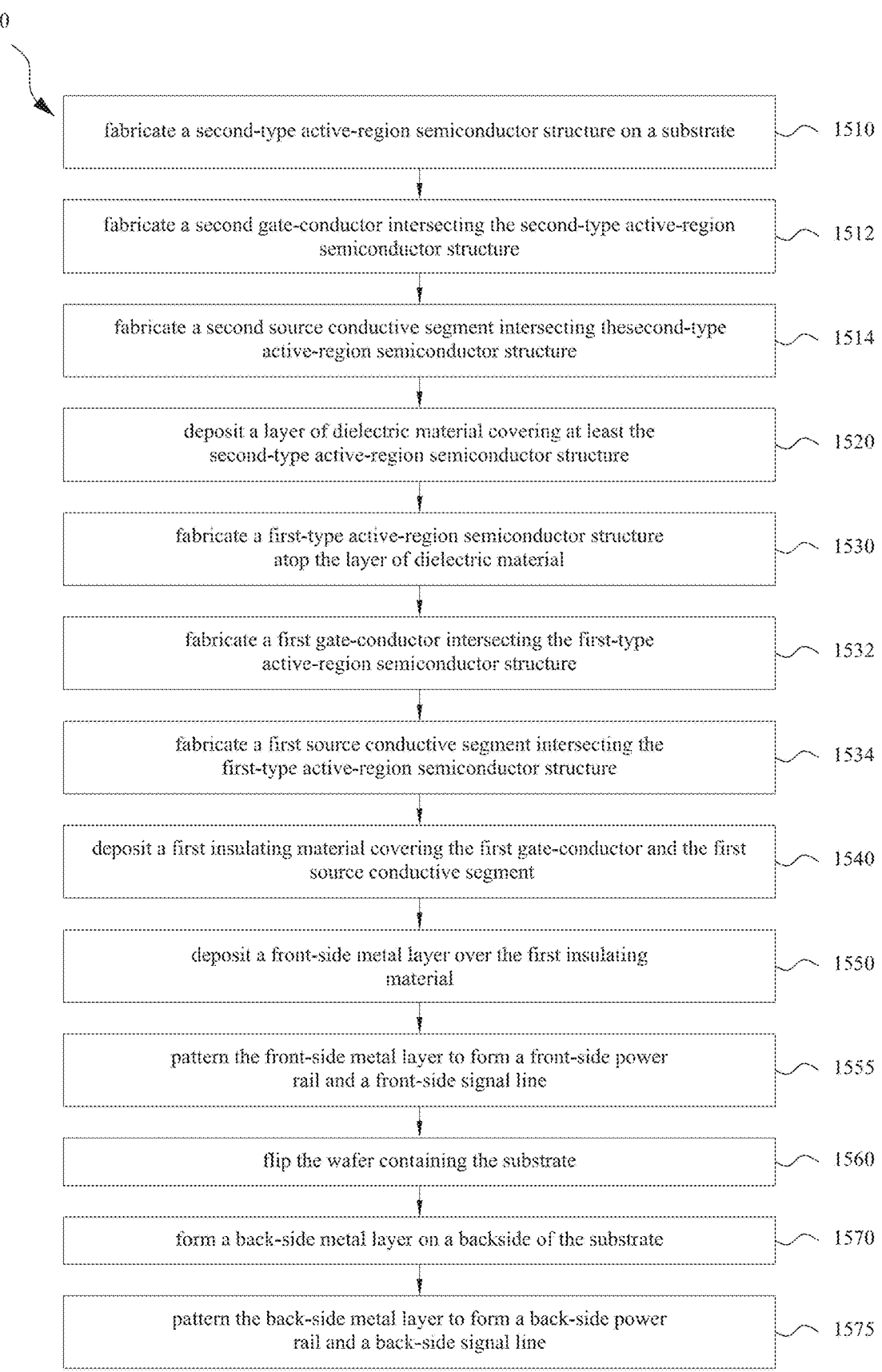

1500

| | |
|---|---|
| fabricate a second-type active-region semiconductor structure on a substrate | 1510 |
| fabricate a second gate-conductor intersecting the second-type active-region semiconductor structure | 1512 |
| fabricate a second source conductive segment intersecting thesecond-type active-region semiconductor structure | 1514 |
| deposit a layer of dielectric material covering at least the second-type active-region semiconductor structure | 1520 |
| fabricate a first-type active-region semiconductor structure atop the layer of dielectric material | 1530 |
| fabricate a first gate-conductor intersecting the first-type active-region semiconductor structure | 1532 |
| fabricate a first source conductive segment intersecting the first-type active-region semiconductor structure | 1534 |
| deposit a first insulating material covering the first gate-conductor and the first source conductive segment | 1540 |
| deposit a front-side metal layer over the first insulating material | 1550 |
| pattern the front-side metal layer to form a front-side power rail and a front-side signal line | 1555 |
| flip the wafer containing the substrate | 1560 |
| form a back-side metal layer on a backside of the substrate | 1570 |
| pattern the back-side metal layer to form a back-side power rail and a back-side signal line | 1575 |

FIG. 15

POWER RAIL AND SIGNAL LINE ARRANGEMENT IN INTEGRATED CIRCUITS HAVING STACKED TRANSISTORS

PRIORITY CLAIM

The present application is a continuation of U.S. application Ser. No. 17/390, 177, filed Jul. 30, 2021 and issued as U.S. Pat. No. 11,764,154, each of which is incorporated herein by reference in its entirety. The present application is also related to U.S. application Ser. No. 18/469,309, filed Sep. 18, 2023, which is a divisional of U.S. application Ser. No. 17/390,177.

BACKGROUND

An integrated circuit (IC) typically includes a number of IC devices that are manufactured in accordance with one or more IC layout diagrams. IC devices sometimes include complementary field effect transistor (CFET) devices. A CFET device generally has an upper FET overlying a lower FET in a stacked configuration. Both the upper FET and the lower FET in a CFET device are positioned above the conductive lines in a back-side conductive layer but below the conductive lines in a front-side conductive layer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 9C is a Transistor Table according to the locations of the transistors in the layout diagram of FIG. 9A, in accordance with some embodiments.

FIG. 10C is a Transistor Table according to the locations of the transistors in the layout diagram of FIG. 10A, in accordance with some embodiments.

FIG. 12A and FIG. 12B are correspondingly the upper portion and the lower portion of a layout diagram of a multi-cell circuit, in accordance with some embodiments.

FIG. 13 are layout diagrams of a circuit cell having labeled dimensions, in accordance with some embodiments.

FIG. 14 is a flowchart of a method of generating an integrated circuit (IC) layout diagram, in accordance with some embodiments.

FIG. 15 is a flowchart of a method 1500 of manufacturing an integrated circuit (IC) having CFET devices, in accordance with some embodiments.

DETAILED DESCRIPTION

Figure 1A:
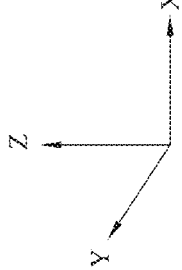
FIG. 1A is a diagram of an inverter circuit having power rails and signal lines in both a front-side conductive layer and a back-side conductive layer, in accordance with some embodiments.

The following disclosure provides many different embodiments, or examples, for implementing different features of the provided subject matter. Specific examples of components, materials, values, steps, operations, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A complementary field effect transistor (CFET transistor) generally has a first-type transistor stacked with a second-type transistor. The first-type transistor has a channel region in a first-type active-region semiconductor structure, and the second-type transistor has a channel region in a second-type active-region semiconductor structure. An IC device having CFET transistors often includes a front-side conductive layer above the CFET transistors and a back-side conductive layer below the CFET transistors. In at least some embodiments, the device performance of the IC device having CFET transistors depends upon the positioning of the power rails and the signal lines. In some embodiments, when a cell circuit in the IC device is powered by a first supply voltage maintained on a front-side power rail in the front-side conductive layer and by a second supply voltage maintained on a back-side power rail in the back-side conductive layer, the power connections to the cell circuit are improved with reduced resistance between the cell circuit and the power rails. Additionally, in some embodiments, when both front-side signal lines in the front-side conductive layer and back-side signal lines in the back-side conductive layer are available for connecting the CFET transistors in the IC device, some restrictions on width extensions of the active-region semiconductor structures are eliminated. Furthermore, in some embodiments, when the front-side power rails in the IC device are interlaced with the front-side signal lines and the back-side power rails in the IC device are interlaced with the back-side signal lines, inter-cell signal shielding for the front-side signal lines are improved by the front-side power rails and inter-cell signal shielding for the back-side signal lines are improved by the back-side power rails.

Figure 7A:
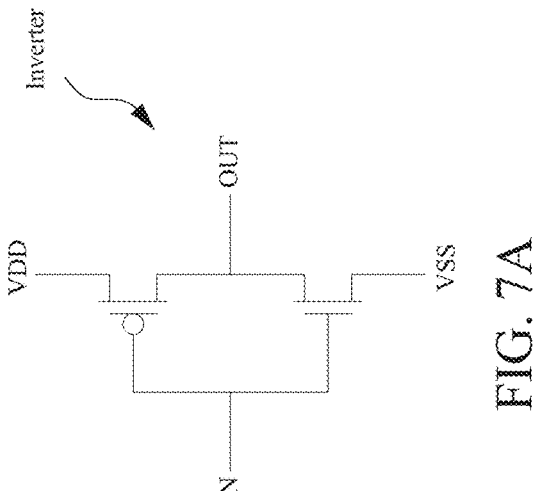
FIGS. 7A-7B are circuit diagrams of an inverter circuit and a sub-circuit, in accordance with some embodiments.

FIG. 1A is a diagram of an inverter circuit 100, implemented with a CFET, having power rails and signal lines in both a front-side conductive layer and a back-side conductive layer, in accordance with some embodiments. The circuit diagram of an inverter circuit is shown in FIG. 7A. The inverter circuit in FIG. 7A includes a PMOS device and an NMOS device. The gate terminals of the PMOS device and the NMOS device are connected together while functioning as an input terminal of the inverter. The drain terminals of the PMOS device and the NMOS device are connected together while functioning as an output terminal of the inverter. The source terminals of the PMOS device and the NMOS device are correspondingly maintained at the supply voltage VDD and the supply voltage VSS.

In FIG. 1A, the inverter circuit 100 incudes a p-type active-region semiconductor structure 50p extending in the X-direction and an n-type active-region semiconductor structure 50n extending in the X-direction. The X-direction, the Y-direction, and the Z-direction in FIG. 1A are mutually orthogonal to each other and form an orthogonal coordinate frame. The p-type active-region semiconductor structure 50p is stacked with the n-type active-region semiconductor structure 50n and shifted from the n-type active-region semiconductor structure along the Z-direction. A gate-conductor 150 extending in the Y-direction intersects both the p-type active-region semiconductor structure 50p and the n-type active-region semiconductor structure 50n. The gate-conductor 150 functions as two stacked gate-conductors conductively joined together: one of the two gate-conductors intersects the p-type active-region semiconductor structure 50p at a channel region of a PMOS transistor T1p, and another one of the two gate-conductors intersects the n-type active-region semiconductor structure 50n at a channel region of an NMOS transistor T1n. The gate-conductor 150 is conductively connected to the gate terminals of the PMOS transistor T1p and the NMOS transistor T1n. In some embodiments, each of the p-type active-region semiconductor structure 50p and the n-type active-region semiconductor structure 50n includes one or more nano-sheets, and consequently, each of the PMOS transistor T1p and the NMOS transistor T1n is a nano-sheet transistor. In some embodiments, each of the p-type active-region semiconductor structure 50p and the n-type active-region semiconductor structure 50n includes one or more nano-wires, and consequently, each of the PMOS transistor T1p and the NMOS transistor T1n is a nano-wire transistor.

The inverter circuit 100 also includes conductive segments 132p, 134p, 132n, and 134n. Each of conductive segments 132p and 134p, extending in the Y-direction, intersects the p-type active-region semiconductor structure 50p at one of the terminal regions of the PMOS transistor T1p. Each of conductive segments 132n and 134n, extending in the Y-direction, intersects the n-type active-region semiconductor structure 50n at one of the terminal regions of the NMOS transistor T1n. A terminal region of a transistor is either a source region or a drain region of the transistor. The conductive segment 132p, as a source conductive segment, forms a source terminal of the PMOS transistor T1p. The conductive segment 132n, as a source conductive segment, forms a source terminal of the NMOS transistor T1n. The conductive segment 134p, as a drain conductive segment, forms a drain terminal of the PMOS transistor T1p. The conductive segment 134n, as a drain conductive segment, forms a drain terminal of the NMOS transistor T1n. The conductive segment 134p and the conductive segment 134n are conductively connected through a conductive-segment inter-connector VMD. While the drain terminals of the PMOS transistor T1p and the NMOS transistor T1n are conductively connected together by the conductive-segment inter-connector VMD, the source terminal of the PMOS transistor T1p is conductively connected to a front-side power rail 30F through a top via-connector VT, and the source terminal of the NMOS transistor T2n is conductively connected to a back-side power rail 30B through a bottom via-connector VB. The front-side power rail 30F is configured to be held at a first supply voltage VDD, and the back-side power rail 30B is configured to be held at a second supply voltage VSS.

The front-side power rail 30F extending in the X-direction is in a front-side conductive layer. The back-side power rail 30B extending in the X-direction is in a back-side conductive layer. Each of the front-side conductive layer and the back-side conductive layer is in a plane having the normal vector orientated towards the Z-direction. The front-side conductive layer is above both the p-type active-region semiconductor structure 50p and the n-type active-region semiconductor structure 50n. The back-side conductive layer is below both the p-type active-region semiconductor structure 50p and the n-type active-region semiconductor structure 50n. In some embodiments, the back-side conductive layer is fabricated on a substrate as a buried conductive layer, and then, the n-type active-region semiconductor structure 50n is fabricated above the buried conductive layer. Subsequently, the p-type active-region semiconductor structure 50p is fabricated above the n-type active-region semiconductor structure 50n, and the front-side conductive layer is fabricated above the p-type active-region semiconductor structure 50p. Other arrangements of the back-side conductive layer are also within the contemplated scope of the present disclosure.

In FIG. 1A, the inverter circuit 100 includes front-side signal lines 120F and 140F in the front-side conductive layer and also back-side signal lines 120B and 140B in the back-side conductive layer. The front-side signal line 120F is conductively connected to the gate-conductor 150 through a top gate-via-connector VG and configured as an input signal line of the inverter circuit. The front-side signal line 140F is conductively connected to the conductive segment 134n through a bottom-to-top via-connector VBT and configured as an output signal line of the inverter circuit. In some embodiments, while the back-side signal lines 120B and 140B in FIG. 1A are not directly connected to any circuit nodes in the inverter circuit 100, the back-side signal lines 120B and 140B are configured to route signals between neighboring cells at opposite sides of the inverter circuit. For example, in some embodiments, through one of the back-side signal lines 120B and 140B, a signal from a neighboring cell adjacent to the conductive segments 132p and 132n is coupled to another neighboring cell adjacent to the conductive segments 134p and 134n.

Figure 1B:
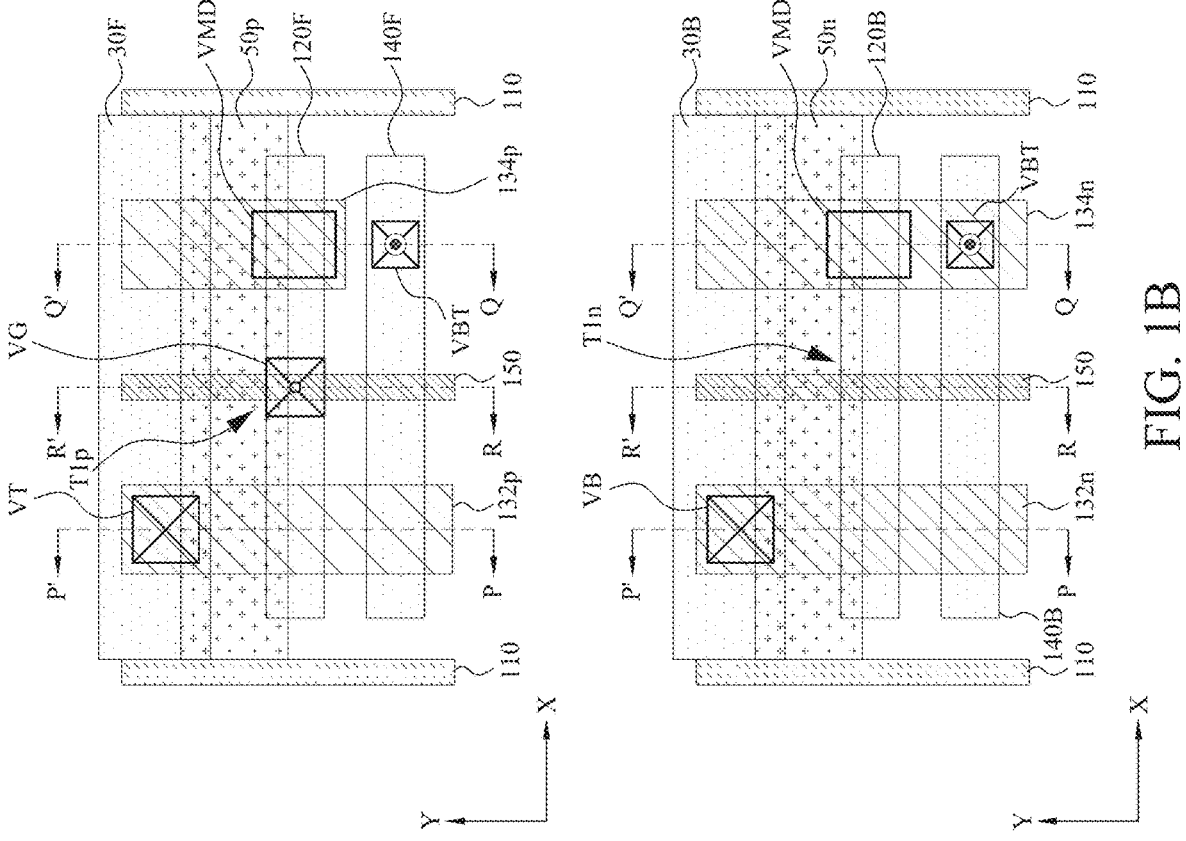
FIG. 1B are layout diagrams of the inverter circuit depicted in FIG. 1A, in accordance with some embodiments.

FIG. 1B are layout diagrams of the inverter circuit 100 depicted in FIG. 1A, in accordance with some embodiments. The layout diagrams in FIG. 1B include an upper portion of the layout and a lower portion of the layout. The upper portion of the layout includes the layout patterns for specifying the p-type active-region semiconductor structure 50p, the gate-conductor 150, the conductive segments 132p and 134p, the front-side signal lines 120F and 140F, the front-side power rail 30F, the conductive-segment inter-connector VMD, and various via-connectors. The lower portion of the layout includes the layout patterns for specifying the n-type active-region semiconductor structure 50n, the gate-conductor 150, the conductive segments 132n and 134n, the back-side signal lines 120B and 140B, the back-side power rail 30B, the conductive-segment inter-connector VMD, and various via-connectors.

As specified by the upper portion of FIG. 1B, each of the p-type active-region semiconductor structure 50p, the front-side signal lines 120F and 140F, and the front-side power rail 30F are extending in the X-direction. The gate-conductor 150 extending in the Y-direction intersects the p-type active-region semiconductor structure 50p at the channel region of a PMOS transistor. The conductive segment 132p extending in the Y-direction intersects the p-type active-region semiconductor structure 50p at the source region of the PMOS transistor. The conductive segment 134p extending in the Y-direction intersects the p-type active-region semiconductor structure 50p at the drain region of the PMOS transistor.

The via-connector pattern VT at the intersection between the conductive segment 132p and the front-side power rail 30F specifies that the conductive segment 132p and the front-side power rail 30F are conductively connected through a top via-connector VT. The gate-via-connector pattern VG at the intersection between the gate-conductor 150 and the front-side signal lines 120F specifies that the gate-conductor 150 and the front-side signal lines 120F are conductively connected through a top gate-via-connector VG.

As specified by the lower portion of FIG. 1B, each of the n-type active-region semiconductor structure 50n, the back-side signal lines 120B and 140B, and the back-side power rail 30B are extending in the X-direction. The gate-conductor 150 extending in the Y-direction intersects the n-type active-region semiconductor structure 50n at the channel region of a NMOS transistor. The conductive segment 132n extending in the Y-direction intersects the n-type active-region semiconductor structure 50n at the source region of the NMOS transistor. The conductive segment 134n extending in the Y-direction intersects the n-type active-region semiconductor structure 50n at the drain region of the NMOS transistor. The via-connector pattern VB at the intersection between the conductive segment 132n and the back-side power rail 30B specifies that, in the inverter circuit 100, the conductive segment 132n and the back-side power rail 30B are conductively connected through a bottom via-connector VB.

In FIG. 1B, the bottom-to-top via-connector pattern VBT overlying the front-side signal lines 140F in the upper portion and the bottom-to-top via-connector pattern VBT overlying the back-side signal lines 140B in the lower portion are matched with each other in identical shapes and at identical positions in the X-Y coordinate. The matched bottom-to-top via-connector patterns VBT in the layout diagrams specify that the front-side signal lines 140F and the back-side signal lines 140B in the inverter circuit 100 are conductively connected together along the Z-direction through a bottom-to-top via-connector VBT. The bottom-to-top via-connector patterns VBT appear as a matched pair in the upper portion and the lower portion of FIG. 1B. In FIG. 1B, the inter-connector pattern VMD overlying the conductive segment 134p in the upper portion and the inter-connector pattern VMD overlying the conductive segment 134n in the lower portion are matched with each other in identical shapes and at identical positions in the X-Y coordinate. The matched inter-connector patterns VMD in the layout diagrams specify that the conductive segment 134p and the conductive segment 134n in the inverter circuit 100 are conductively connected together through a conductive-segment inter-connector VMD. The inter-connector patterns VMD appear as a matched pair in the upper portion and the lower portion of FIG. 1B.

In FIG. 1B, the upper portion and the lower portion of the layout also includes dummy gate-strips patterns 110 for specifying the dummy gate-strips at the edges of the inverter cell. In some embodiments, the intersections between dummy gate-strip patterns 110 and the layout pattern of the p-type active-region semiconductor structure 50p specify the isolation regions in the p-type active-region semiconductor structure 50p for isolating the p-type active-region in the inverter cell from the active-regions in the neighboring cells. In some embodiments, the intersections between dummy gate-strip patterns 110 and the layout pattern of the n-type active-region semiconductor structure 50n specify the isolation regions in the n-type active-region semiconductor structure 50n for isolating the n-type active-region in the inverter cell from the active-regions in the neighboring cells. In some embodiments, the isolation regions in the active-region semiconductor structures (50p or 50n) are created based on the poly on oxide definition edge (PODE) technology or based on the continuous poly on oxide definition (CPODE) technology. Other suitable technologies for generating the isolation regions in the active-region semiconductor structures (50p or 50n) are also within the contemplated scope of present disclosure.

Figure 1C:
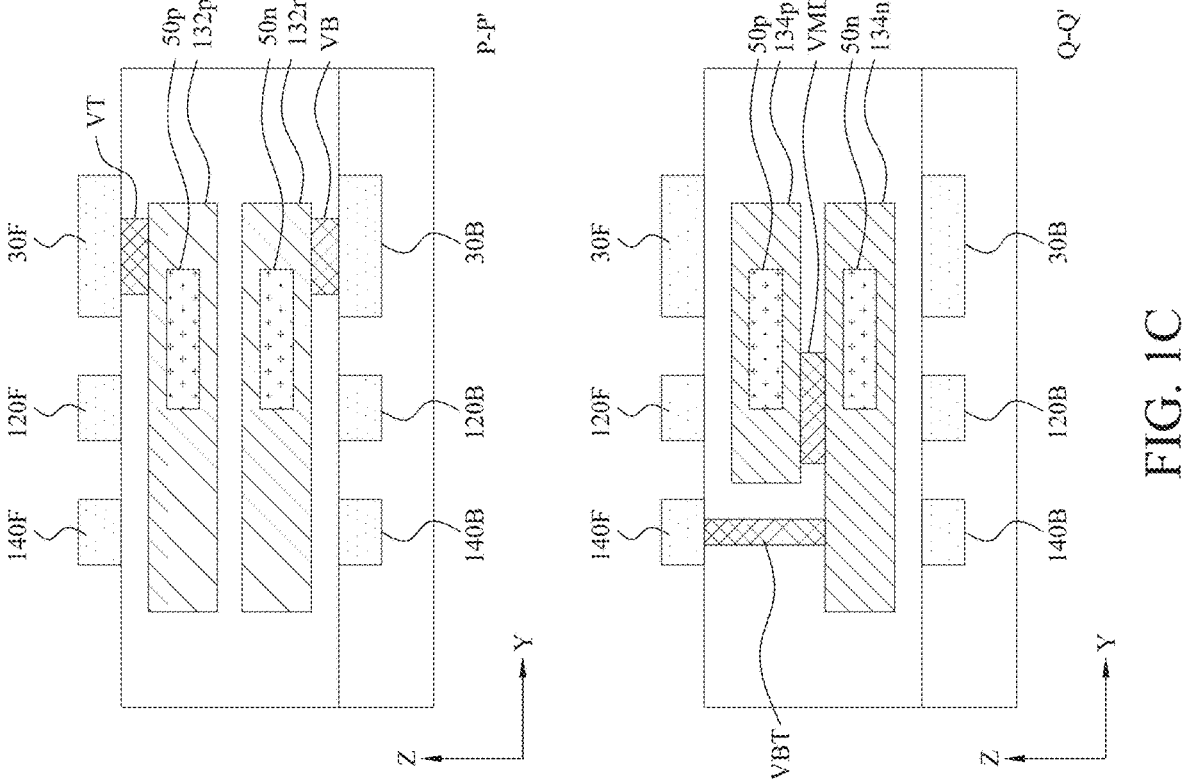
FIG. 1C is cross-sectional views of the inverter circuit of FIG. 1A, in accordance with some embodiments.
Figure 1D:
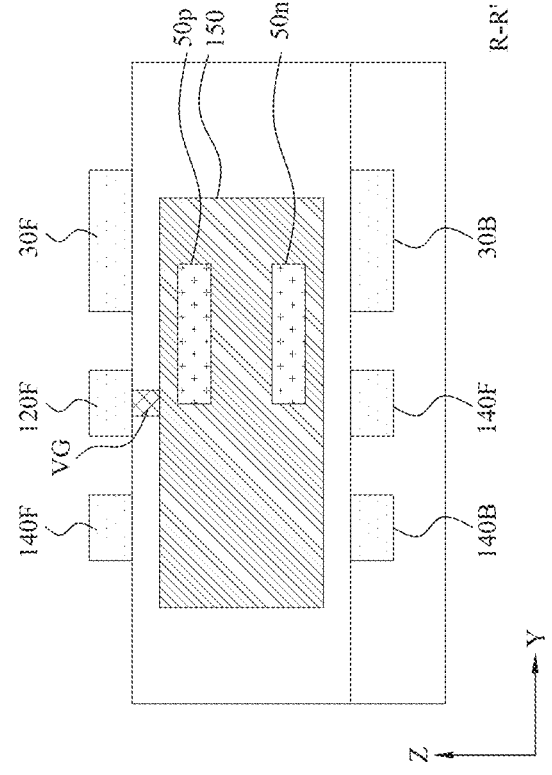
FIG. 1D is cross-sectional views of inverter circuit of FIG. 1A, in accordance with some embodiments.

FIG. 1C is cross-sectional views of inverter circuit 100 of FIG. 1A in cutting planes as specified by the line P-P' and the line Q-Q' in FIG. 1B, in accordance with some embodiments. FIG. 1D is cross-sectional views of inverter circuit 100 of FIG. 1A in cutting planes as specified by the line R-R' in FIG. 1B, in accordance with some embodiments. In FIG. 1C and FIG. 1D, the p-type active-region semiconductor structure 50p is stacked with n-type active-region semiconductor structure 50n. The front-side signal lines 120F and 140F and the front-side power rail 30F are in the front-side conductive layer which is above the p-type active-region semiconductor structure 50p and the n-type active-region semiconductor structure 50n. The back-side signal lines 120B and 140B and the back-side power rail 30B are in the back-side conductive layer which is below the p-type active-region semiconductor structure 50p and the n-type active-region semiconductor structure 50n.

In FIG. 1C, as shown in the cross-sectional view of the P-P' cutting plane, the conductive segment 132p intersects the p-type active-region semiconductor structure 50p at a source region of the PMOS transistor, and the conductive segment 132n intersects the n-type active-region semiconductor structure 50n at a source region of the NMOS transistor. The conductive segment 132p is conductively connected to the front-side power rail 30F through a top via-connector VT, and the conductive segment 132n is conductively connected to the back-side power rail 30B through a bottom via-connector VB.

In FIG. 1C, as shown in the cross-sectional view of the Q-Q' cutting plane, the conductive segment 134p intersects the p-type active-region semiconductor structure 50p at a drain region of the PMOS transistor, and the conductive segment 134n intersects the n-type active-region semiconductor structure 50n at a drain region of the NMOS transistor. The conductive segment 134n is conductively connected to the front-side signal line 140F through a bottom-to-top via-connector VBT. The conductive segment 134p is conductively connected to the conductive segment 134n through a conductive-segment inter-connector VMD.

In FIG. 1D, as shown in the cross-sectional view of the R-R' cutting plane, the gate-conductor 150 intersects the p-type active-region semiconductor structure 50p at a channel region of the PMOS transistor and intersects the n-type active-region semiconductor structure 50n at a channel region of the NMOS transistor. The front-side signal line 120F is conductively connected to the gate-conductor 150 through a top gate-via-connector pattern VG.

Figure 4A:
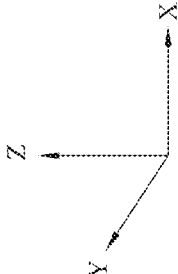
FIG. 4A is a modification of the inverter circuit in FIG. 3A, in accordance with some embodiments.
Figure 5A:
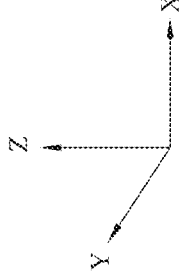
FIG. 5A is a modification of the inverter circuit in FIG. 4A, in accordance with some embodiments.
Figure 6A:
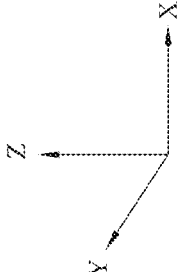
FIG. 6A is a modification of the inverter circuit in FIG. 5A, in accordance with some embodiments.

In addition to the example design and example implementation of the inverter circuit 100 as depicted in FIG. 1A, there are other designs and implementations of the inverter circuit. Each of the diagrams in FIG. 2A, FIG. 3A. FIG. 4A. FIG. 5A, and FIG. 6A is a diagram of an inverter circuit, implemented with a CFET, having power rails and signal lines in both a front-side conductive layer and a back-side conductive layer, in accordance with some embodiments.

Figure 2A:
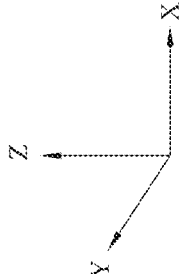
FIG. 2A is a modification of the inverter circuit in FIG. 1A, in accordance with some embodiments.

The inverter circuit 200 in FIG. 2A is a modification of the inverter circuit 100 in FIG. 1A. The bottom-to-top via-connector VBT in FIG. 1A is substituted with a bottom via-connector VB in FIG. 2A. The bottom via-connector VB conductively connects the conductive segment 134n with the back-side signal line 140B. In FIG. 2A, the back-side signal line 140B is configured as the output signal line of the inverter circuit. As a comparison, in FIG. 1A, the front-side signal line 140F is configured as the output signal line of the inverter circuit.

Figure 2B:
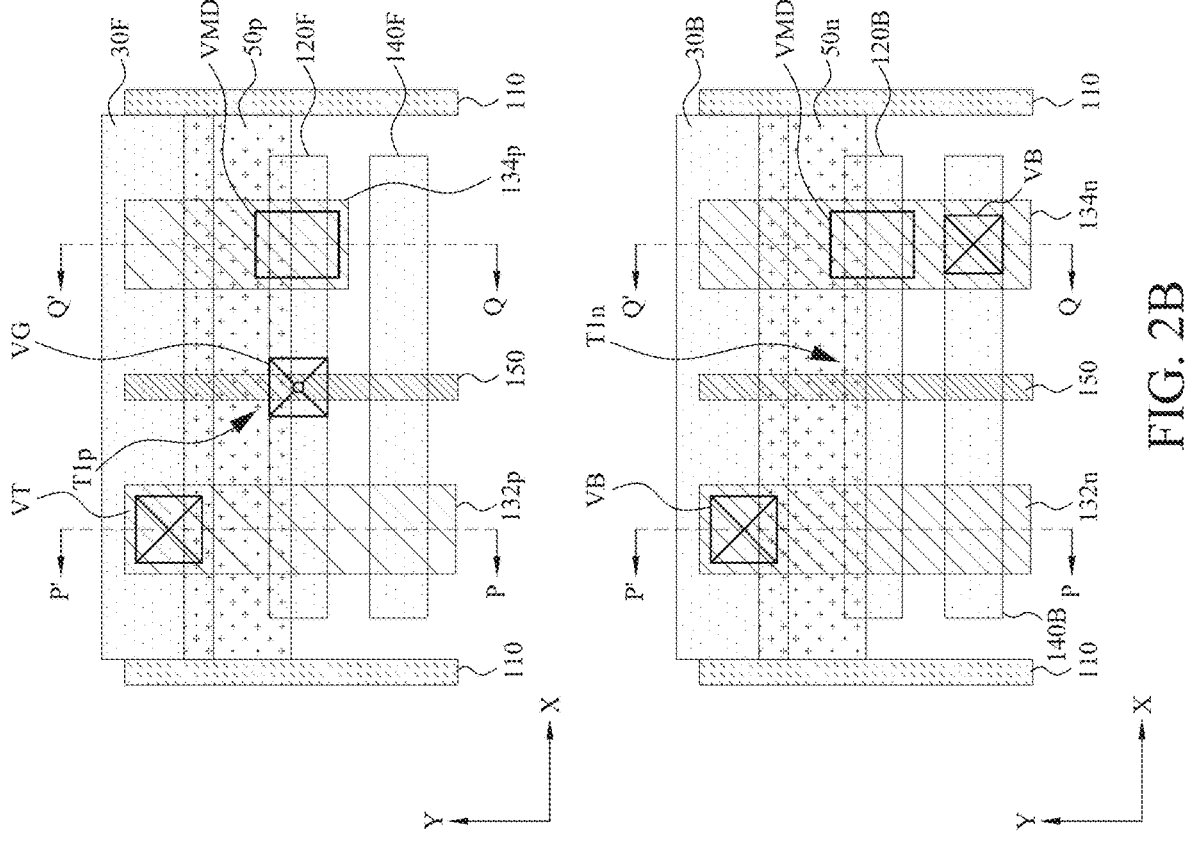
FIG. 2B are layout diagrams of the inverter circuit in FIG. 2A, in accordance with some embodiments.

FIG. 2B are layout diagrams of the inverter circuit 200 in FIG. 2A, in accordance with some embodiments. The layout diagrams in FIG. 2B are almost the same as the layout diagrams in FIG. 1B, except that the pair of matched bottom-to-top via-connector patterns VBT in the upper portion and the lower portion of FIG. 1B is removed and a bottom via-connector pattern VB is added in the lower portion of FIG. 2B at the intersection between the conductive segment 134n and the back-side signal line 140B, which specifies that the conductive segment 134n is conductively connected to the back-side signal line 140B though a bottom via-connector VB.

Figure 2C:
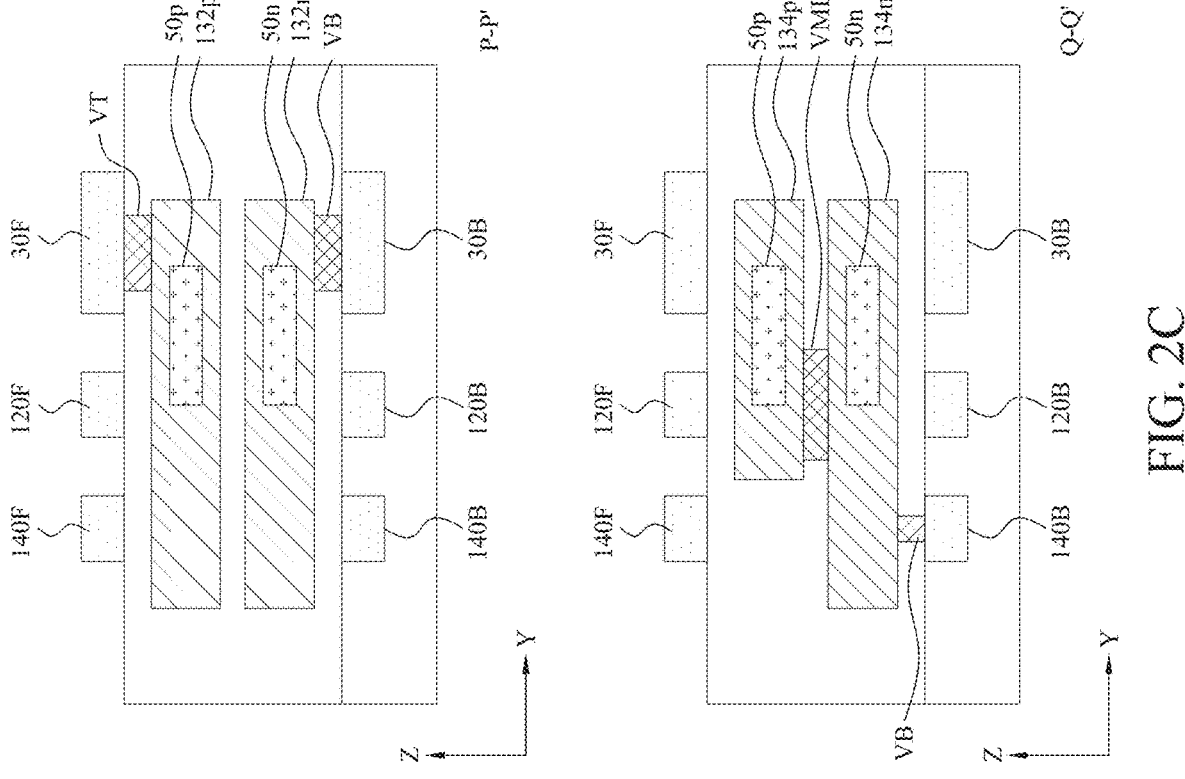
FIG. 2C is cross-sectional views of the inverter circuit in FIG. 2A, in accordance with some embodiments.

FIG. 2C is cross-sectional views of the inverter circuit 200 in FIG. 2A in cutting planes as specified by the line P-P' and the line Q-Q' in FIG. 2B, in accordance with some embodiments. The cross-section of the cutting plane P-P' in FIG. 2C is identical to the cross-section of the cutting plane P-P' in FIG. 1C. The cross-section of the cutting plane Q-Q' in FIG. 2C is almost the same as the cross-section of the cutting plane Q-Q' in FIG. 1C, except that bottom-to-top via-connector patterns VBT connecting the front-side signal line 140F to the conductive segment 134n in FIG. 1C is replaced with the bottom via-connector VB connecting the back-side signal line 140B to the conductive segment 134n.

Figure 3A:
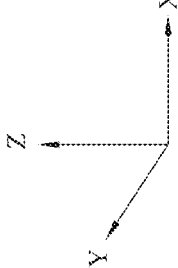
FIG. 3A is another modification of the inverter circuit in FIG. 1A, in accordance with some embodiments.

The inverter circuit 300 in FIG. 3A is another modification of the inverter circuit 100 in FIG. 1A. The modification includes removing the conductive-segment inter-connector VMD in FIG. 1A, and changing terminal functions of the conductive segments 132p and 134p. The conductive segment 134p in FIG. 3A functions as a source terminal of the PMOS transistor, while the conductive segment 134p in FIG. 1A functions as a drain terminal of the PMOS transistor. The conductive segment 132p in FIG. 3A functions as a drain terminal of the PMOS transistor, while the conductive segment 132p in FIG. 1A functions as a source terminal of the PMOS transistor. In FIG. 3A, the source terminal of the PMOS transistor is configured to receive the power supply voltage VDD from the front-side power rail 30F through a top via-connector VT at a location of the front-side power rail 30F near the conductive segment 134p. In FIG. 3A, the drain terminal of the PMOS transistor and the drain terminal of the NMOS transistor are conductively connected through the conductive connection from the conductive segment 132p to the conductive segment 134n. The conductive segment 132p is conductively connected to the front-side signal line 140F through a top via-connector VT, and the front-side signal line 140F is conductively connected to the conductive segment 134n through a bottom-to-top via-connector VBT.

Figure 3B:
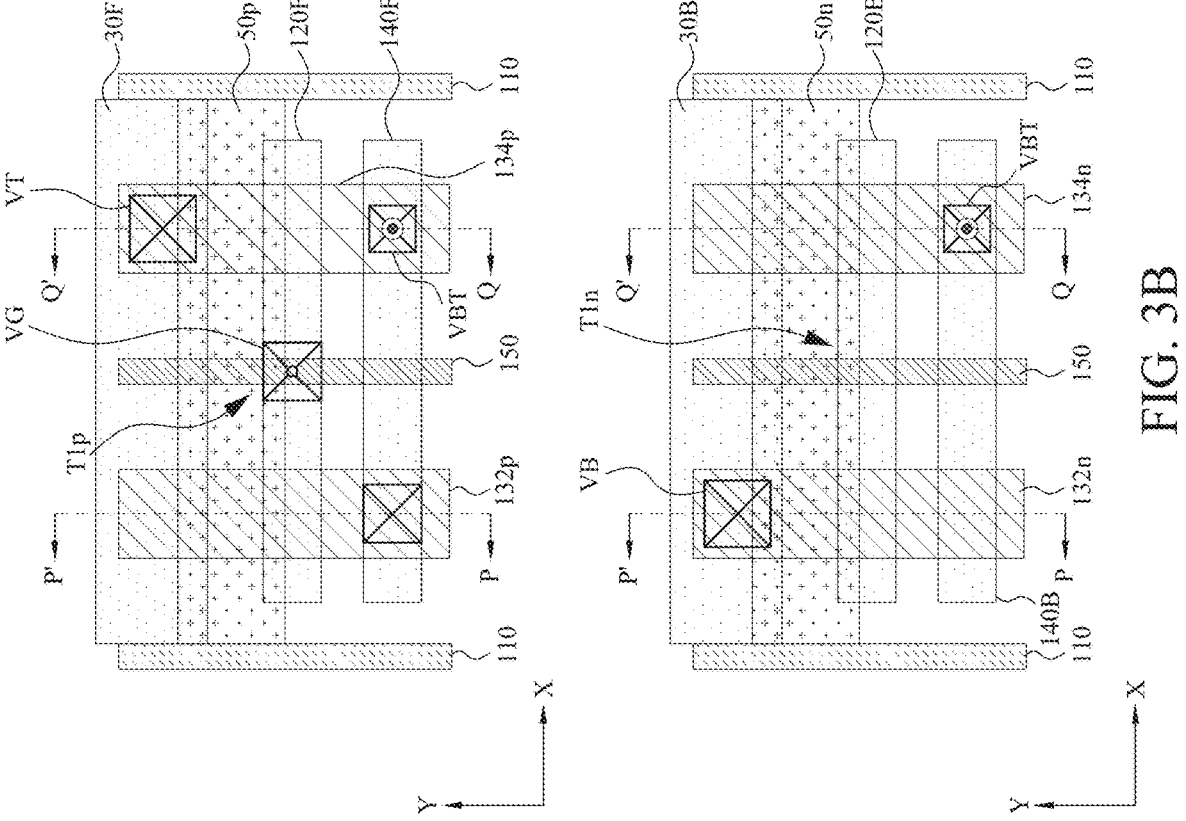
FIG. 3B are layout diagrams of the inverter circuit in FIG. 3A, in accordance with some embodiments.

FIG. 3B are layout diagrams of the inverter circuit 300 in FIG. 3A, in accordance with some embodiments. The layout diagrams in FIG. 3B are a modification of the layout diagrams in FIG. 1B. The modification includes removing the pair of matched inter-connector patterns VMD in the upper portion and the lower portion of FIG. 1B, moving the top via-connector pattern VT on the front-side power rail 30F to a new position at the intersection between the conductive segment 134p and the front-side power rail 30F, and adding a new top via-connector pattern VT at the intersection between the conductive segment 132p and the front-side signal line 140F.

Figure 3C:
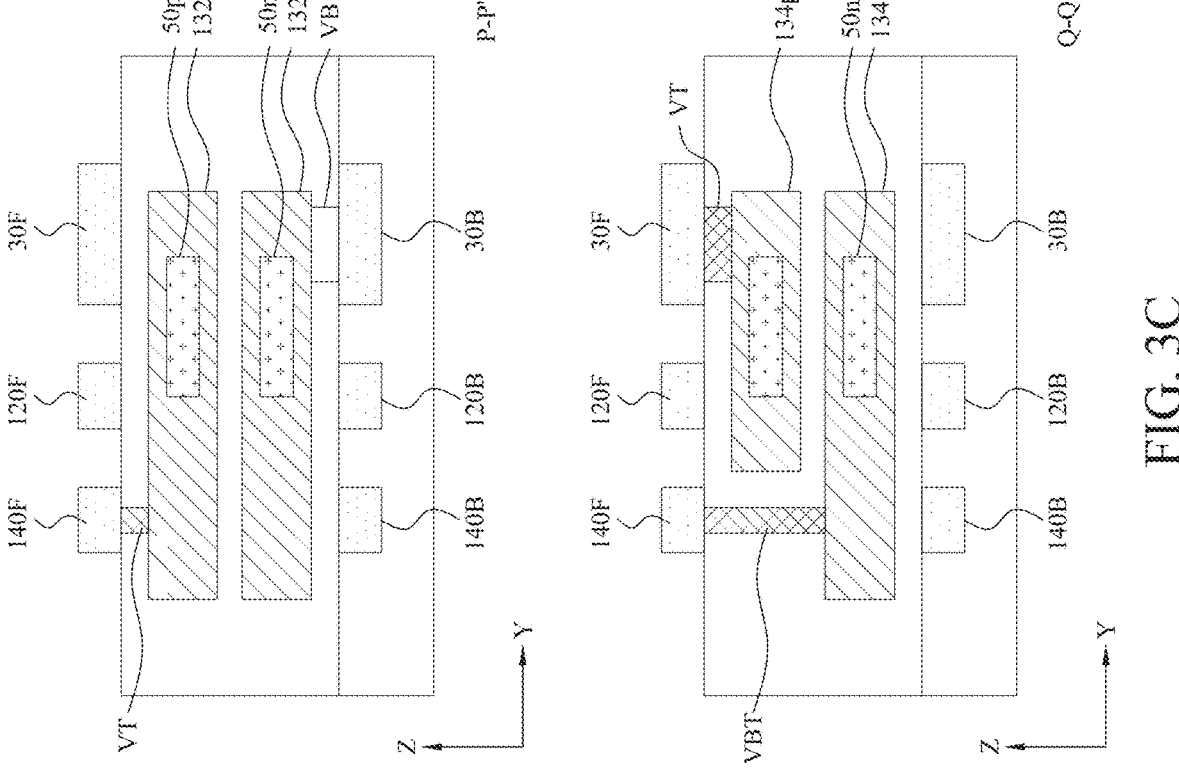
FIG. 3C is cross-sectional views of the inverter circuit in FIG. 3A, in accordance with some embodiments.

FIG. 3C is cross-sectional views of the inverter circuit 300 in FIG. 3A in cutting planes as specified by the line P-P' and the line Q-Q' in FIG. 3B, in accordance with some embodiments. The cross-section of the cutting plane P-P' in FIG. 3C is almost the same as the cross-section of the cutting plane P-P' in FIG. 1C, except that the top via-connector VT in FIG. 1C connecting the front-side power rail 30F to the conductive segment 132p is replaced with a top via-connector VT in FIG. 3C connecting the front-side signal line 140F to the conductive segment 132p. The cross-section of the cutting plane Q-Q' in FIG. 3C is almost the same as the cross-section of the cutting plane Q-Q' in FIG. 1C, except that the conductive-segment inter-connector VMD in FIG. 1C connecting the conductive segments 134p and 134n is removed and a top via-connector VT is added in FIG. 3C connecting the front-side power rail 30F to the conductive segment 134p.

The inverter circuit 400 in FIG. 4A is a modification of the inverter circuit 300 in FIG. 3A. The modification includes changing the conductive connection from the conductive segment 132p to the conductive segment 134n. In FIG. 4A, the conductive segment 132p is conductively connected to the back-side signal line 140B through a top-to-bottom via-connector VTB, and the back-side signal line 140B is conductively connected to the conductive segment 134n through a bottom via-connector VB. The back-side signal line 140B is configured as the output signal line of the inverter circuit 400.

Figure 4B:
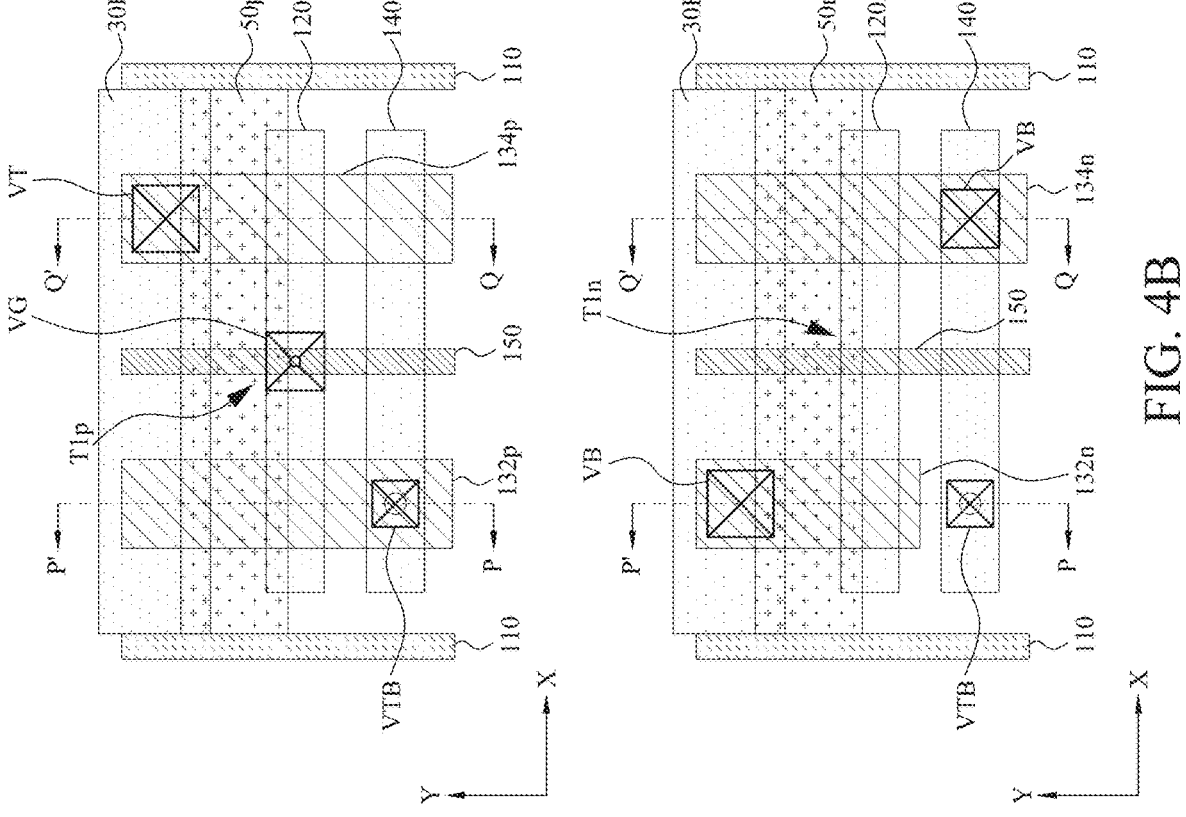
FIG. 4B are layout diagrams of the inverter circuit in FIG. 4A, in accordance with some embodiments.

FIG. 4B are layout diagrams of the inverter circuit 400 in FIG. 4A, in accordance with some embodiments. The layout diagrams in FIG. 4B are a modification of the layout diagrams in FIG. 3B. In FIG. 4B, the pair of matched top-to-bottom via-connector patterns VTB in the upper portion and the lower portion of FIG. 1B specifies that the conductive segment 132p is conductively connected to the back-side signal line 140B through a top-to-bottom via-connector VTB. The bottom via-connector pattern VB at the intersection of the conductive segment 134n and the back-side signal line 140B specifies the bottom via-connector pattern VB connecting the conductive segment 134n to the back-side signal line 140B.

Figure 4C:
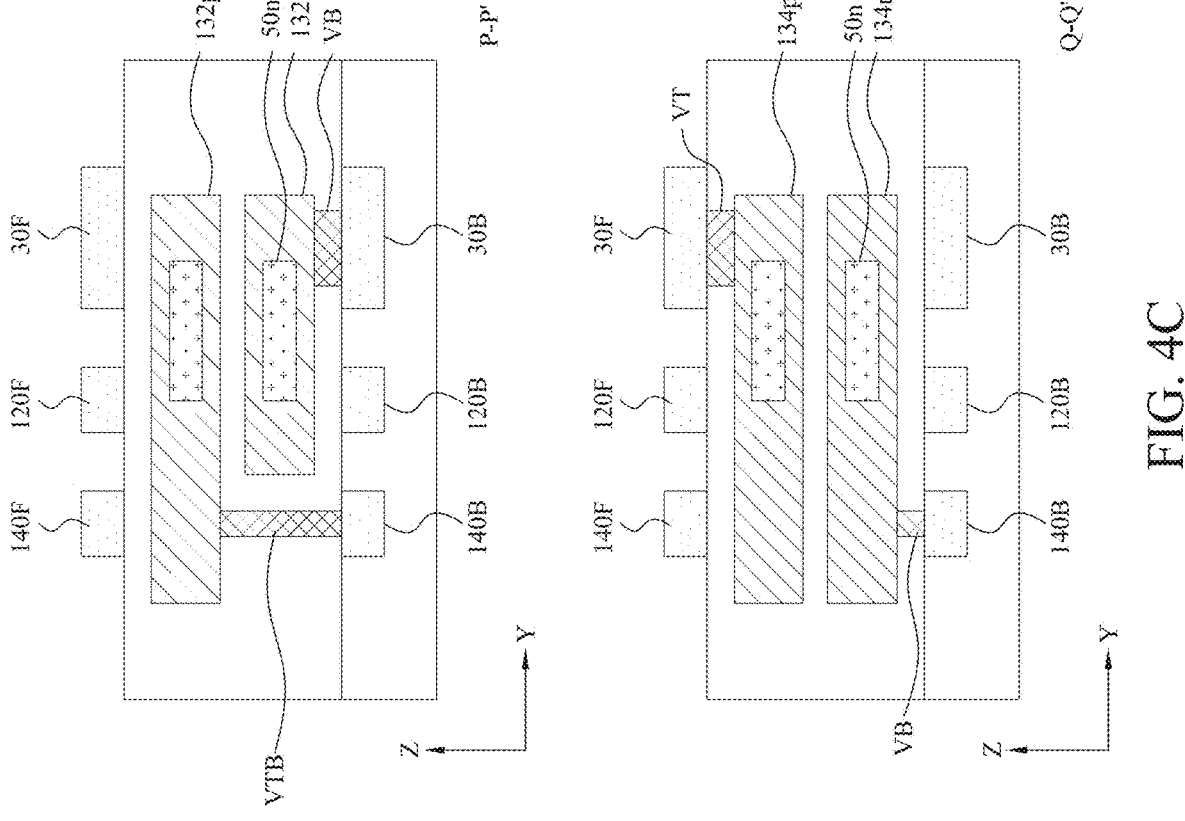
FIG. 4C is cross-sectional views of the inverter circuit in FIG. 4A, in accordance with some embodiments.

FIG. 4C is cross-sectional views of the inverter circuit 400 in FIG. 4A in cutting planes as specified by the line P-P' and the line Q-Q' in FIG. 4B, in accordance with some embodiments. The cross-section of the cutting plane P-P' in FIG. 4C is almost the same as the cross-section of the cutting plane P-P' in FIG. 3C, except that top via-connector VT in FIG. 3C connecting the front-side signal line 140F to the conductive segment 132p is replaced with the top-to-bottom via-connector VTB connecting the conductive segment 132p to the back-side signal line 140B. The cross-section of the cutting plane Q-Q' in FIG. 4C is almost the same as the cross-section of the cutting plane Q-Q' in FIG. 3C, except that a bottom via-connector VB is added in in FIG. 4C connecting the conductive segment 134n to the back-side signal line 140B.

The inverter circuit 500 in FIG. 5A is a modification of the inverter circuit 400 in FIG. 4A. In the inverter circuit 500 of FIG. 5A, the front-side signal line 140F is configured as the input signal line, and the front-side signal line 120F is configured as the output signal line. As a comparison, in the inverter circuit 400 of FIG. 4A, the front-side signal line 120F is configured as the input signal line, and the back-side signal line 140B is configured as the output signal line. In FIG. 5A, the gate-conductor 150 is conductively connected to the front-side signal line 140F through a top gate-via-connector VG, and the conductive segment 132p is conductively connected to the front-side signal line 120F through a top via-connector VT.

Figure 5B:
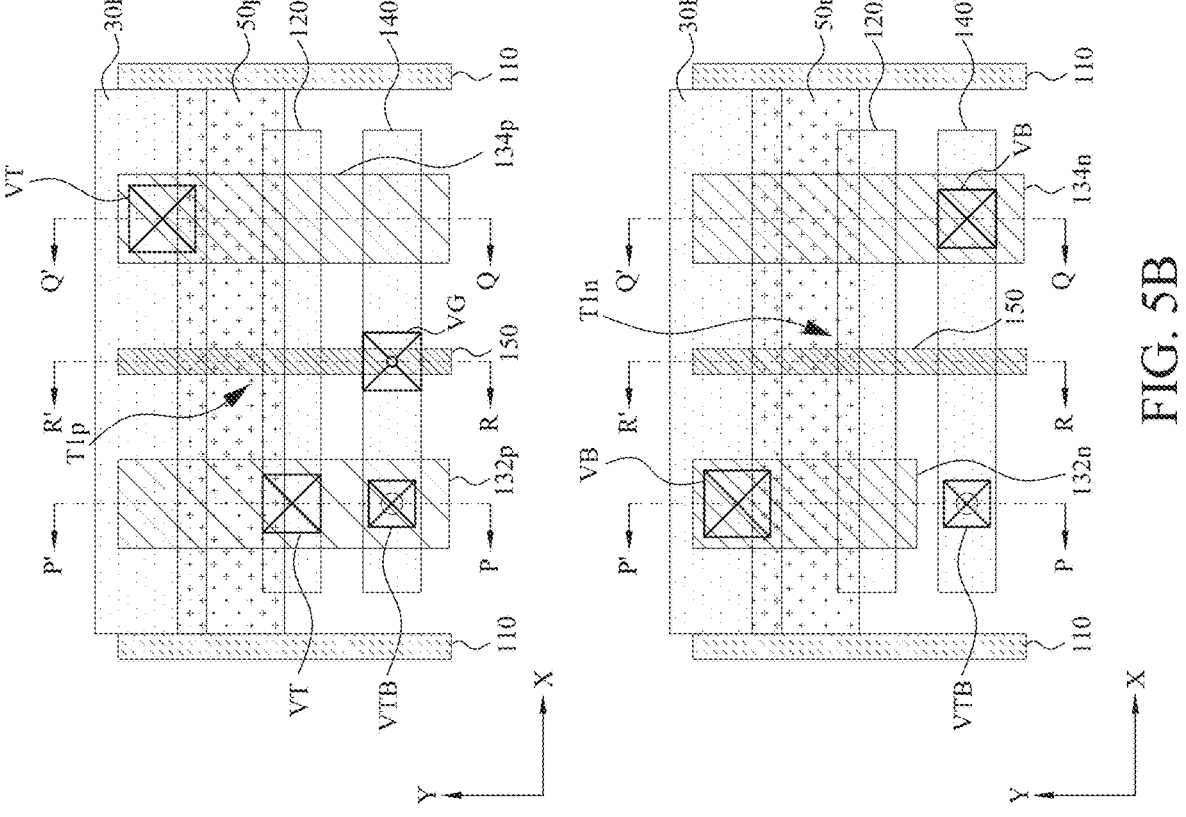
FIG. 5B are layout diagrams of the inverter circuit in FIG. 5A, in accordance with some embodiments.

FIG. 5B are layout diagrams of the inverter circuit 500 in FIG. 5A, in accordance with some embodiments. The lower portion of FIG. 5B is identical to the lower portion of FIG. 4B. The upper portion of FIG. 5B is a modification of the upper portion of FIG. 4B. The top gate-via-connector pattern VG in FIG. 4B overlying the layout pattern of the gate-conductor 150 is moved to a new position overlying the layout pattern of the front-side signal line 140F. A top via-connector pattern VT is added at the intersection between the conductive segment 132p and the front-side signal line 120F.

Figure 5C:
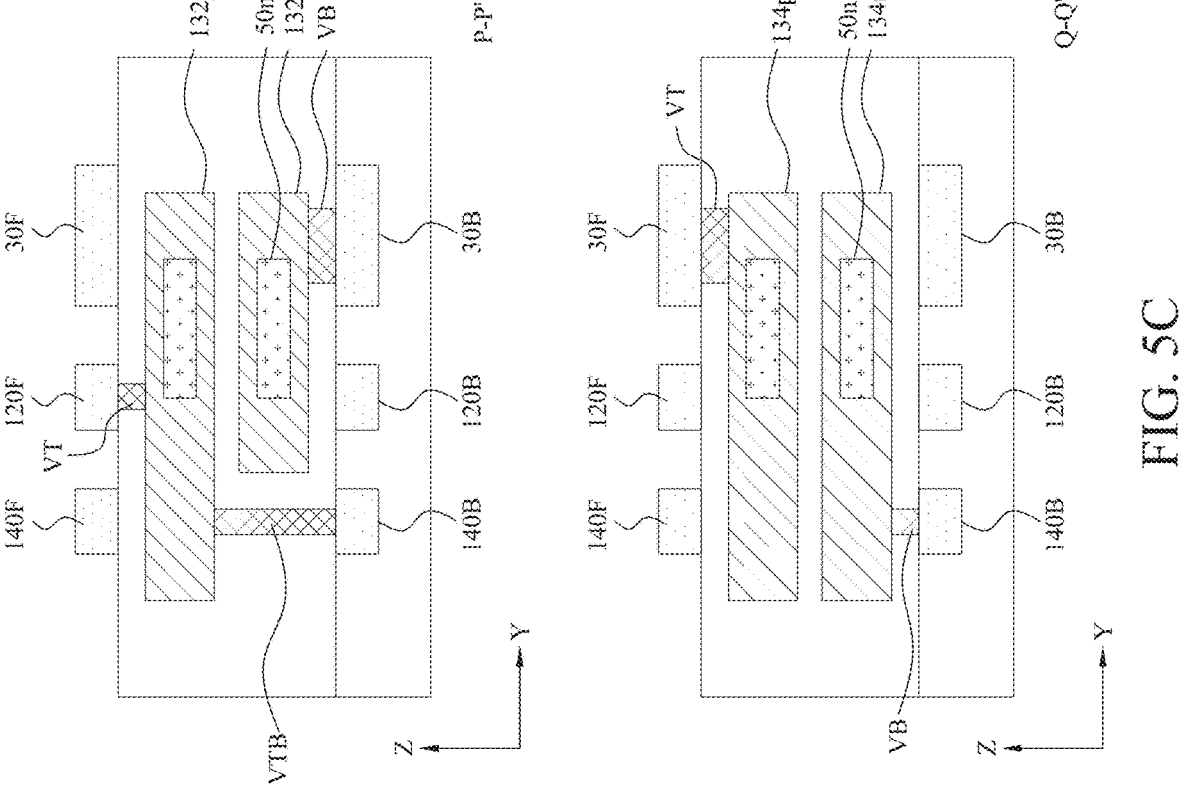
FIG. 5C is cross-sectional views of the inverter circuit in FIG. 5A, in accordance with some embodiments.

FIG. 5C is cross-sectional views of the inverter circuit 500 in FIG. 5A in cutting planes as specified by the line P-P' and the line Q-Q' in FIG. 5B, in accordance with some embodiments. The cross-section of the cutting plane Q-Q' in FIG. 5C is identical to the cross-section of the cutting plane Q-Q' in FIG. 4C. The cross-section of the cutting plane P-P' in FIG. 4C is almost the same as the cross-section of the cutting plane P-P' in FIG. 4C, except that a top via-connector VT is added in FIG. 5C connecting the front-side signal line 120F with the conductive segment 132p.

Figure 5D:
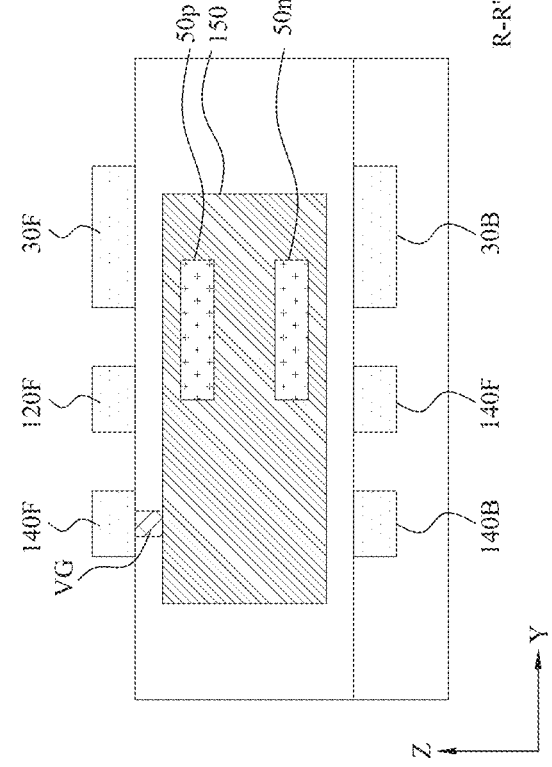
FIG. 5D is cross-sectional views of the inverter circuit in FIG. 5A, in accordance with some embodiments.

FIG. 5D is cross-sectional views of the inverter circuit 500 in FIG. 5A in cutting planes as specified by the line R-R' in FIG. 5B, in accordance with some embodiments. The cross-sectional view in FIG. 5D is a modification from in the cross-sectional view in FIG. 1D. The top gate-via-connector VG in FIG. 5D conductively connects the front-side signal line 140F to the gate-conductor 150, whereas the top gate-via-connector VG in FIG. 1D conductively connects the front-side signal line 120F to the gate-conductor 150.

The inverter circuit 600 in FIG. 6A is a modification of the inverter circuit 500 in FIG. 5A. The inverter circuit 600 of FIG. 6A uses the back-side signal line 120B as the input signal line, while the inverter circuit 500 of FIG. 5A uses the front-side signal line 140 as the input signal line. In FIG. 6A, the gate-conductor 150 is conductively connected to the back-side signal line 120B through a bottom gate-via-connector VG.

Figure 6B:
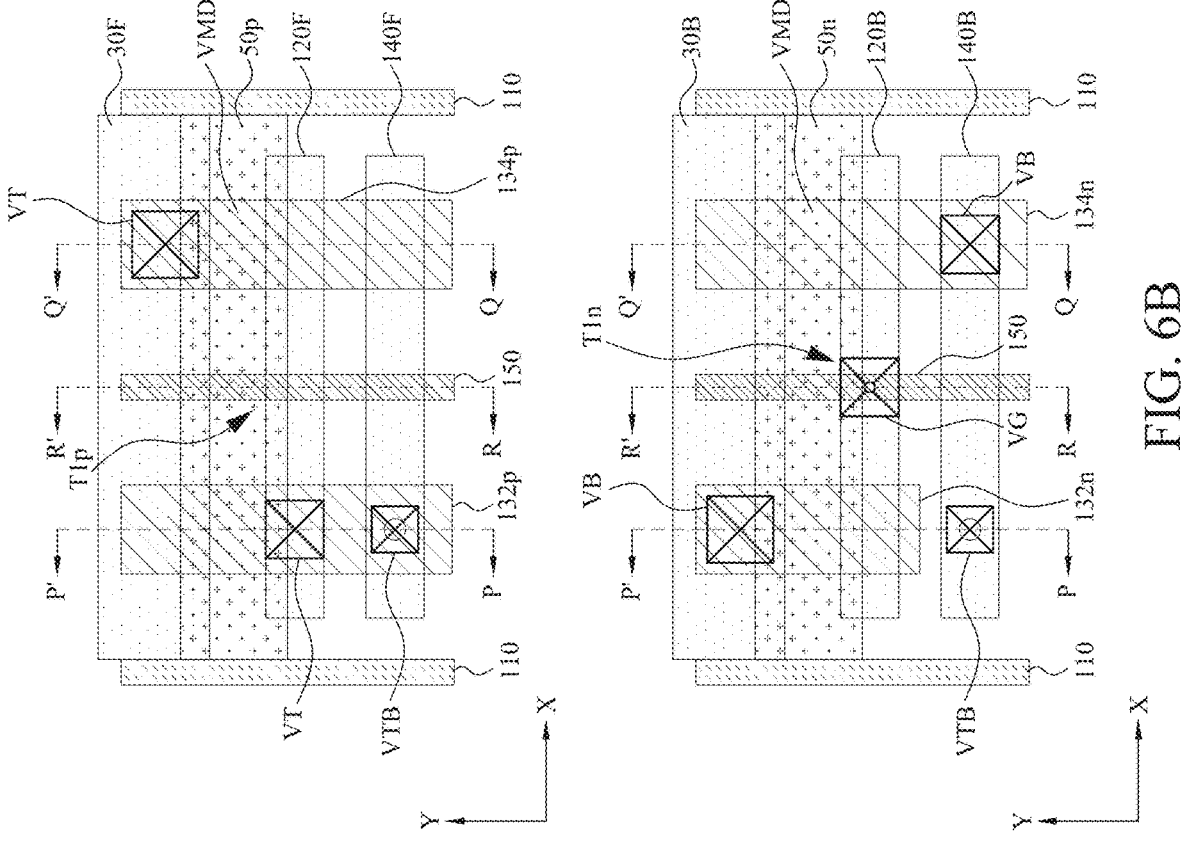
FIG. 6B are layout diagrams of the inverter circuit in FIG. 6A, in accordance with some embodiments.

FIG. 6B are layout diagrams of the inverter circuit 600 in FIG. 6A, in accordance with some embodiments. The layout diagrams in FIG. 6B are a modification of the layout diagrams in FIG. 5B. The top gate-via-connector pattern VG (overlying the layout pattern of the front-side signal line 140F) in the upper portion of FIG. 5B is substituted with a bottom gate-via-connector pattern VG (overlying the layout pattern of the back-side signal line 120B) in the lower portion of FIG. 6B.

Figure 6C:
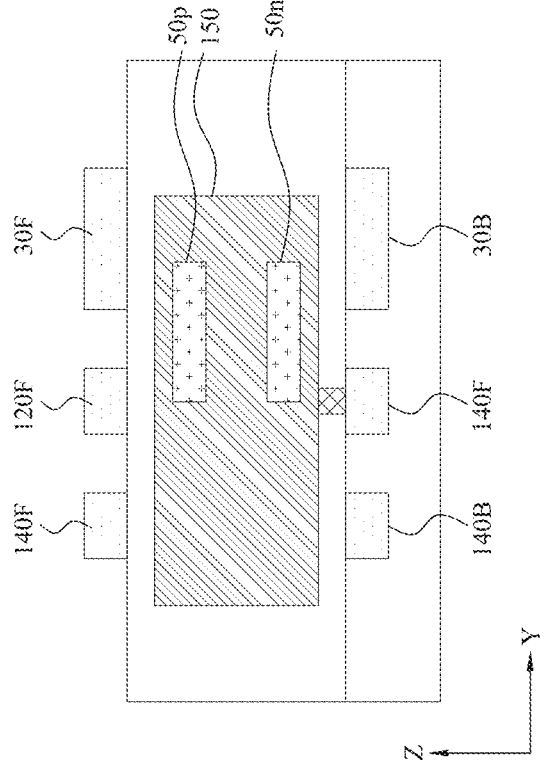
FIG. 6C is cross-sectional views of the inverter circuit in FIG. 6A, in accordance with some embodiments.

FIG. 6C is cross-sectional views of the inverter circuit 600 in FIG. 6A in cutting planes as specified by the line R-R' in FIG. 6B, in accordance with some embodiments. The cross-sectional view in FIG. 6C is a modification from in the cross-sectional view in FIG. 5D. In FIG. 6C, the gate-conductor 150 is conductively connected to the back-side signal line 120B through the bottom gate-via-connector VG. As a comparison, in FIG. 5D, the gate-conductor 150 is conductively connected to the front-side signal line 140F through the top gate-via-connector VG.

The inverter circuit in each of the diagrams in FIG. 1A, FIG. 2A, FIG. 3A. FIG. 4A. FIG. 5A, and FIG. 6A includes a gate-conductor 150 that connects the gate terminal of the PMOS transistor T1p with the gate terminal of the NMOS transistor T1n. In each inverter circuit, the gate terminal of the PMOS transistor T1p and the gate terminal of the NMOS transistor T1n receive the same input logic signal "IN", as shown in FIG. 7A. In some configurations of a sub-circuit, the gate terminal of the PMOS transistor T1p and the gate terminal of the NMOS transistor T1n receive different input logic signals. For example, in the sub-circuit of FIG. 7B, the gate terminal of the PMOS transistor T1p and the gate terminal of the NMOS transistor T1n correspondingly receive input logic signal "IN-A" and input logic signal "IN-B." When the gate terminals of the PMOS transistor and the NMOS transistor in a CFET receive different input signals. The gate-conductor for the PMOS transistor is separated from the gate-conductor for the NMOS transistor by a gate-stack insulator.

Figure 7B:
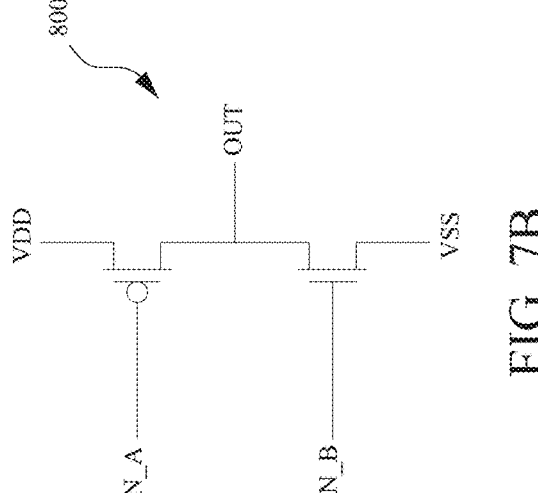
Figure 8A:
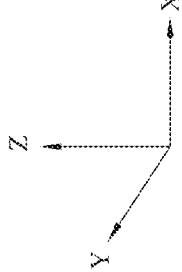
FIG. 8A is a diagram of a sub-circuit in FIG. 7B implemented with a CFET, in accordance with some embodiments.

FIG. 8A is a diagram of a sub-circuit 800 in FIG. 7B implemented with a CFET, in accordance with some embodiments. The sub-circuit 800 in FIG. 8A is modified from the inverter circuit 600 in FIG. 6A by substituting one gate-conductor 150 in FIG. 6A with two gate-conductors 150p and 150n which are electrically insulated from each other. The gate-conductors 150p extending in the Y-direction intersects the p-type active-region semiconductor structure 50p at a channel region of a PMOS transistor T1p. The gate-conductors 150n extending in the Y-direction intersects the n-type active-region semiconductor structure at a channel region of an NMOS transistor T1n. The gate-conductor 150p and the gate-conductor 150n are separated along the Z-direction by the gate-stack insulator 815 extending in the Y-direction. The gate-conductor 150p is conductively connected to the front-side signal line 120F through a top gate-via-connector VG, and the gate-conductor 150n is conductively connected to the back-side signal line 120B through a bottom gate-via-connector VG.

Figure 8B:
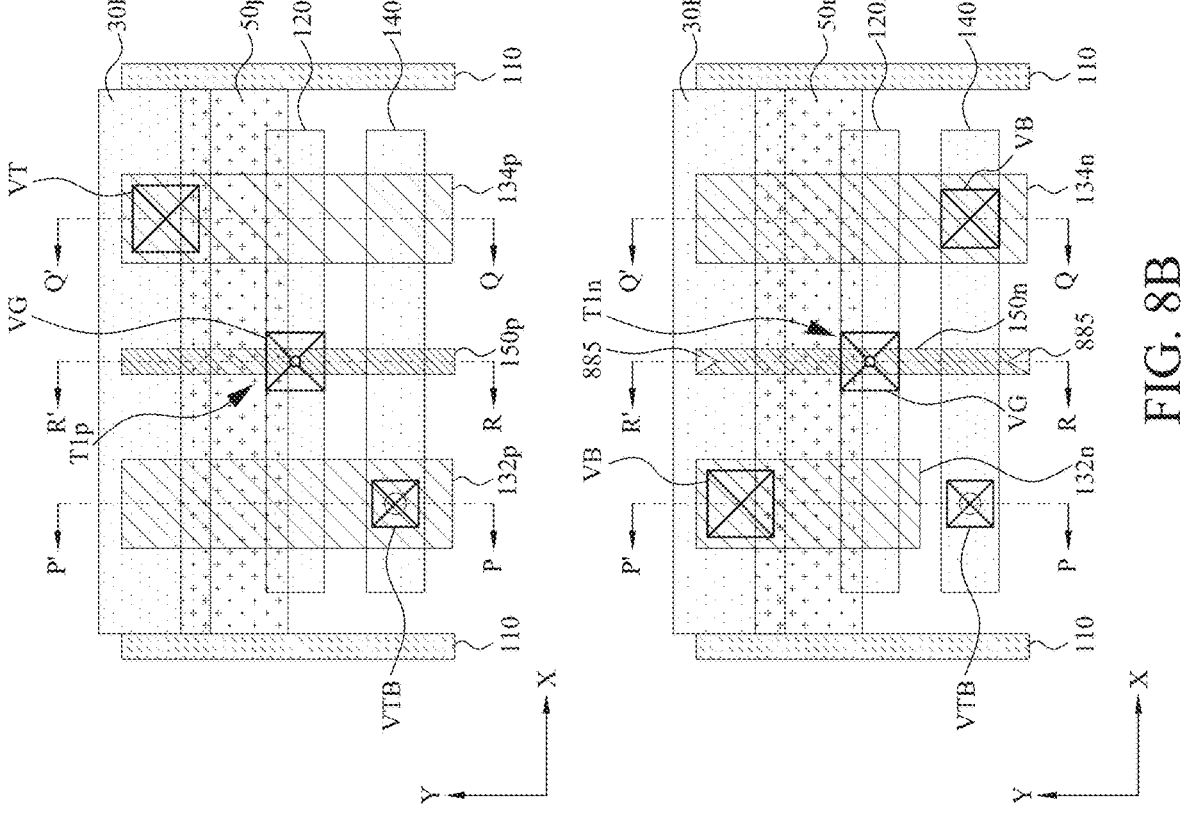
FIG. 8B are layout diagrams of the sub-circuit in FIG. 8A, in accordance with some embodiments.

FIG. 8B are layout diagrams of the sub-circuit 800 in FIG. 8A, in accordance with some embodiments. The layout diagrams in FIG. 8B are almost identical to the layout diagrams in FIG. 6B, except the triangle symbols at each end of the layout pattern for the gate-conductor 150n of FIG. 8B indicate that the gate-conductor pattern 150n is separated from the gate-conductor 150p by a gate-stack insulator 815. There are various embodiments of the layout designs for indicating the separation of two staked gate-conductors by a gate-stack insulator 815. The layout diagram is in FIG. 8B belongs to one of the specific embodiments, in which one or more special symbols 885 (such as the triangle symbols) are placed on at least one of the two staked gate-conductor patterns (e.g., the pattern for gate-conductor 150p or the pattern for gate-conductor 150n). In alternative embodiments, the comparison between the pattern for the gate-conductor 150p and the pattern for the gate-conductor 150n specifies whether the gate-conductor 150p and the gate-conductor 150n are separated by a gate-stack insulator 815. For example, in some embodiments, when the pattern for gate-conductor 150p and the pattern for gate-conductor 150n are different, the layout diagram indicates that the gate-conductor 150p and the gate-conductor 150n are separated by a gate-stack insulator 815. In contrast, in some embodiments, when the pattern for gate-conductor 150p and the pattern for gate-conductor 150n are the same, the layout diagram indicates that the gate-conductor 150p and the gate-conductor 150n are conductively joined together.

Figure 8C:
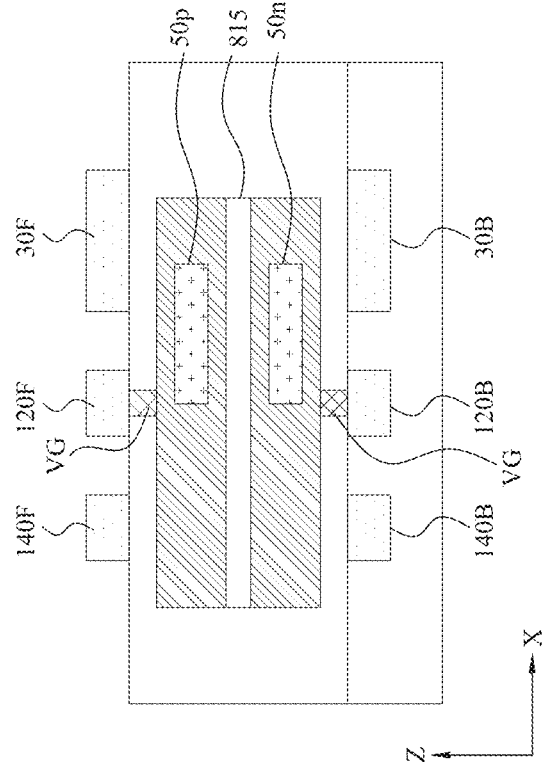
FIG. 8C is cross-sectional views of the sub-circuit in FIG. 8A, in accordance with some embodiments.

FIG. 8C is cross-sectional views of the sub-circuit 800 in FIG. 8A in cutting planes as specified by the line R-R' in FIG. 8B, in accordance with some embodiments. In the cross-section of the cutting plane P-P' in FIG. 8C, the gate-conductor 150n and the gate-conductor 150n are separated by the gate-stack insulator 815. The gate-conductor 150p is conductively connected to the front-side signal line 120F through a top gate-via-connector VG, and the gate-conductor 150n is conductively connected to the back-side signal line 120B through a bottom gate-via-connector VG.

Figure 9A:
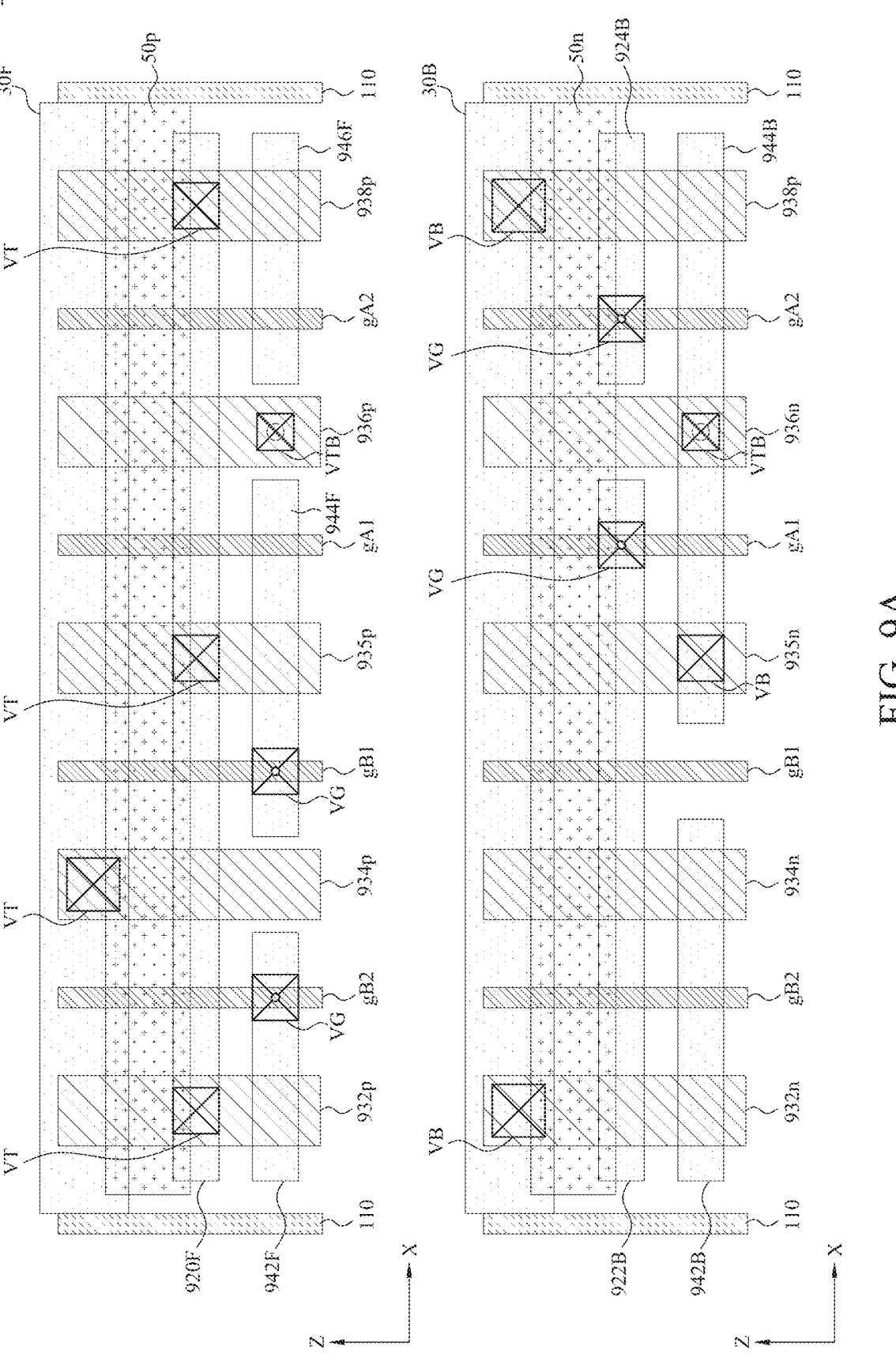
FIG. 9A are layout diagrams of an AOI logic circuit, in accordance with some embodiments.
Figure 9B:
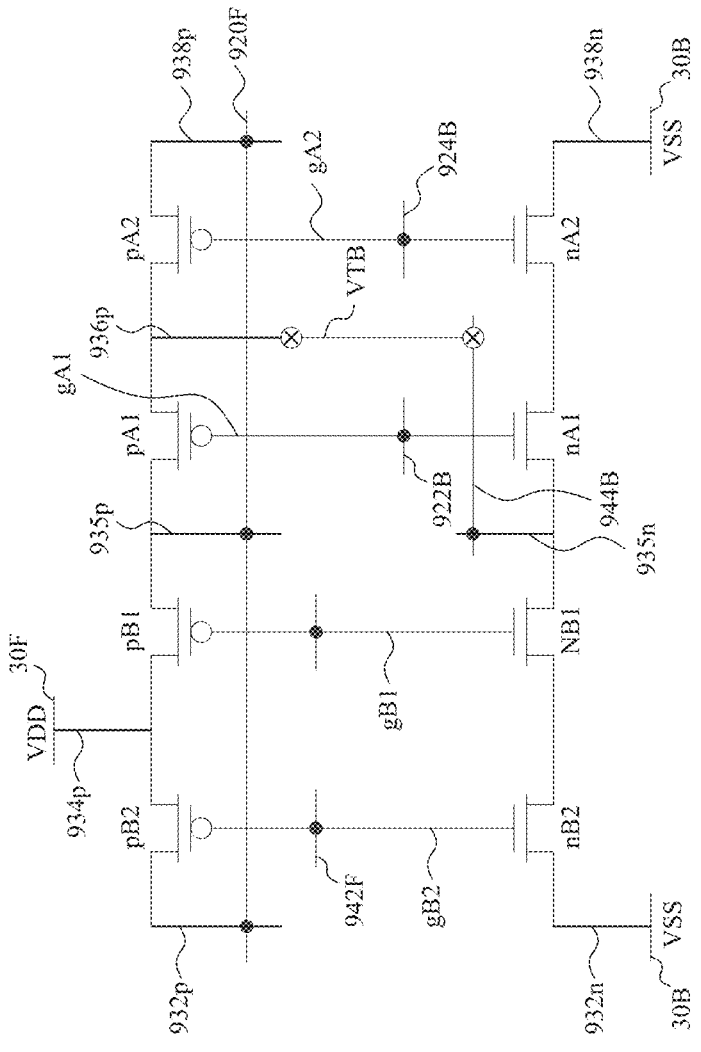
FIG. 9B is a circuit diagram of the AOI logic circuit in FIG. 9A, in accordance with some embodiments.

FIG. 9A are layout diagrams of an AOI logic circuit 900, in accordance with some embodiments. FIG. 9B is a circuit diagram of the AOI logic circuit 900 in FIG. 9A, in accordance with some embodiments. The layout diagram in FIG. 9A includes an upper portion of the layout and a lower portion of the layout. The upper portion of the layout includes the layout patterns for specifying the p-type active-region semiconductor structure 50p, the gate-conductors (gB2, gB1, gA1, and gA2), the conductive segments (932p, 934p, 935p, 936p, and 938p), the front-side signal lines (920F, 942F, 944F, and 946F), the front-side power rail 30F, and various via-connectors. The lower portion of the layout includes the layout patterns for specifying the n-type active-region semiconductor structure 50n, the gate-conductors (gB2, gB1, gA1, and gA2), the conductive segments (932n, 934n, 935n, 936n, and 938n), the back-side signal lines (922B, 924B, 942B, and 944B), the back-side power rail 30B, and various via-connectors.

As specified by the upper portion of FIG. 9A, each of the gate-conductors gB2, gB1, gA1, and gA2 intersects the p-type active-region semiconductor structure 50p at the channel region of a PMOS transistor and forms correspondingly the gate terminals of the p-type transistors pB2, pB1, pA1, and pA2. As specified by the lower portion of FIG. 9A, each of the gate-conductors gB2, gB1, gA1, and gA2 intersects the n-type active-region semiconductor structure 50n at the channel region of a NMOS transistor and forms correspondingly the gate terminals of the n-type transistors nB2, nB1, nA1, and nA2. Each of the p-type transistors pB2, pB1, pA1, and pA2 is stacked with a corresponding one of the n-type transistors nB2, nB1, nA1, and nA2. The p-type transistors and the n-type transistors are listed in the Transistor Table in FIG. 9C according to the locations of the transistors in the upper portion or the lower portion of the layout diagram. The p-type transistors and the n-type transistors are also depicted in the circuit diagram of FIG. 9B according to the locations of the transistors in the upper portion and the lower portion of the layout diagram.

In the layout diagram of FIG. 9A, according to some embodiments, when the patterns for a pair of stacked gate-conductors in the upper portion and the lower portion of the layout diagram are the same, the layout diagram indicates that the gate-conductors in the pair of stacked gate-conductors are conductively joined together. Consequently, as shown in FIG. 9A and FIG. 9B, the gate terminals of the transistors pB2 and nB2 are conductively connected together by the gate-conductor gB2, the gate terminals of the transistors pB1 and nB1 are conductively connected together by the gate-conductor gB1, the gate terminals of the transistors pA1 and nA1 are conductively connected together by the gate-conductor gA1, and the gate terminals of the transistors pA2 and nA2 are conductively connected together by the gate-conductor gA2. Additionally, in FIGS. 9A-9B, the gate-conductors gB2 and gB1 are correspondingly connected to the front-side signal lines 942F and 944F through a corresponding top gate-via-connector VG. The gate-conductors gA1 and gA2 are correspondingly connected to the back-side signal lines 922B and 924B through a corresponding bottom gate-via-connector VG.

Furthermore, as specified by the layout diagram of FIG. 9A and as shown in the circuit diagram of FIG. 9B, each of the conductive segments intersects one of the active-region semiconductor structures. Each of the conductive segments 932p, 934p, 935p, 936p, and 938p intersects the p-type active-region semiconductor structure 50p at a terminal region of a p-type transistor. Each of the conductive segments 932n, 934n, 935n, 936n, and 938n intersects the n-type active-region semiconductor structure 50n at a terminal region of an n-type transistor. The terminal region of a transistor (which is either p-type or n-type) is a source region or a drain region of the transistor.

In FIGS. 9A-9B, the conductive segment 934p is conductively connected to the front-side power rail 30F through a top via-connector VT, and the front-side power rail 30F is configured to be maintained at a first supply voltage VDD. Each of the conductive segments 932n and 938n is conductively connected to the back-side power rail 30B through a corresponding bottom via-connector VB, and the back-side power rail 30B is configured to be maintained at a second supply voltage VSS. Each of the conductive segments 932p, 935p, and 938p is conductively connected to the front-side signal lines 920F through a corresponding top via-connector VT. The conductive segment 935n is conductively connected to the back-side signal line 844B through a corresponding bottom via-connector VB. The back-side signal line 844B is in turn conductively connected to the conductive segments 936p through a corresponding top-to-bottom via-connector VTB. The top-to-bottom via-connector VTB is specified by a pair of corresponding via-connector patterns, in the upper portion and the lower portion of FIG. 9A.

Figure 10A:
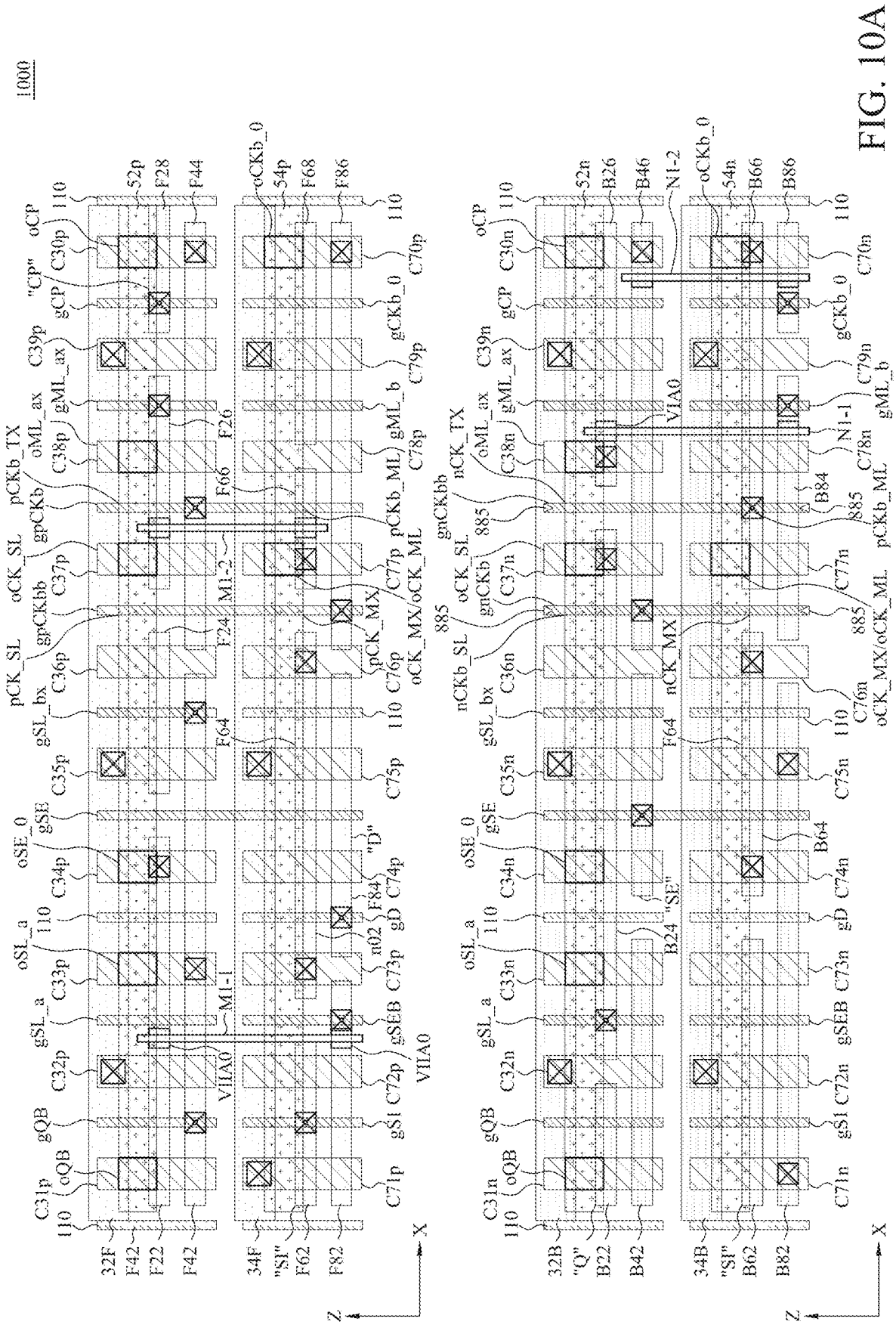
FIG. 10A are layout diagrams of a Scan D Flip-flop (SDF) circuit, in accordance with some embodiments.
Figure 10B:
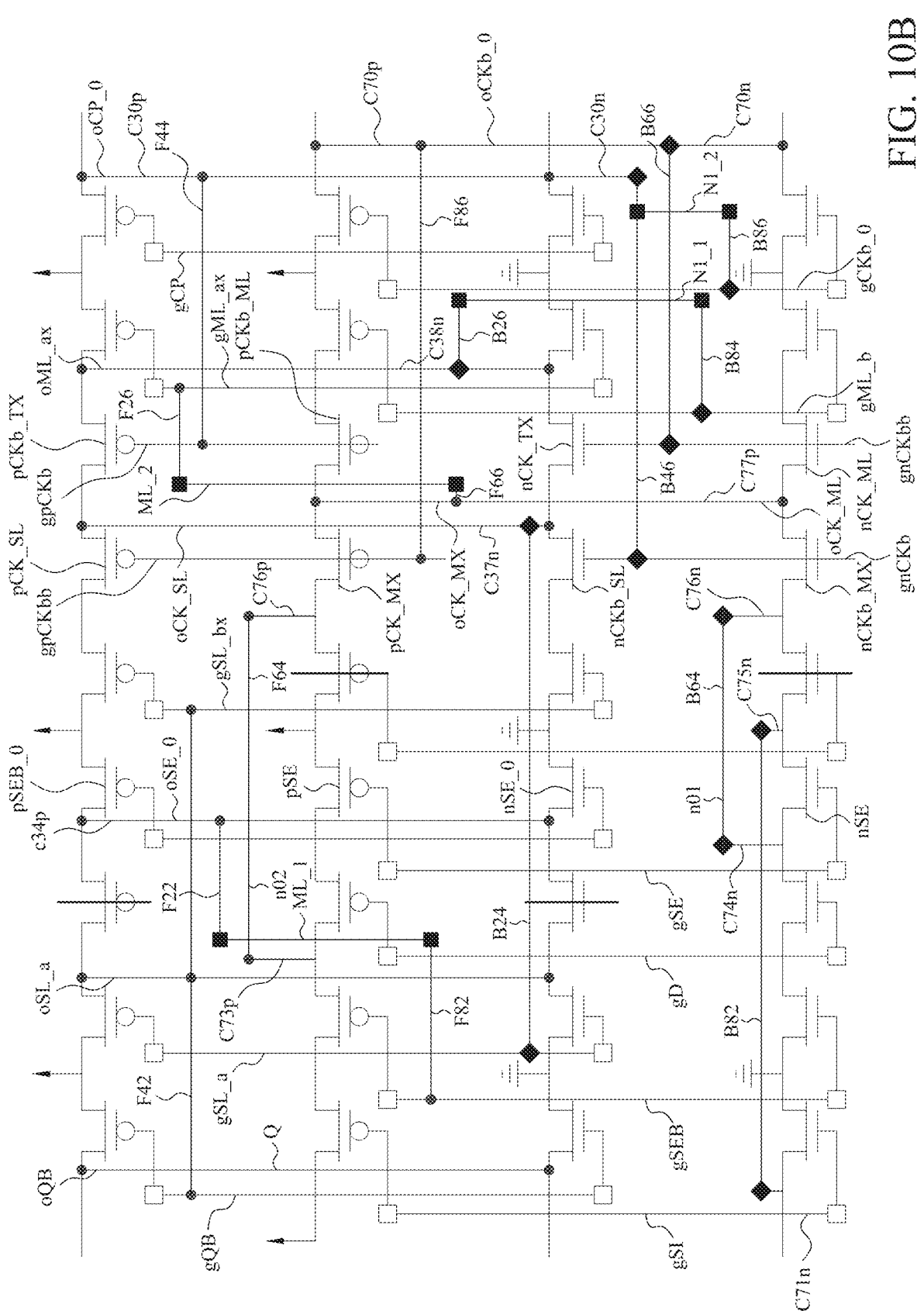
FIG. 10B is a circuit diagram of the SDF circuit as specified by the layout diagrams in FIG. 10A, in accordance with some embodiments.
Figure 11A:
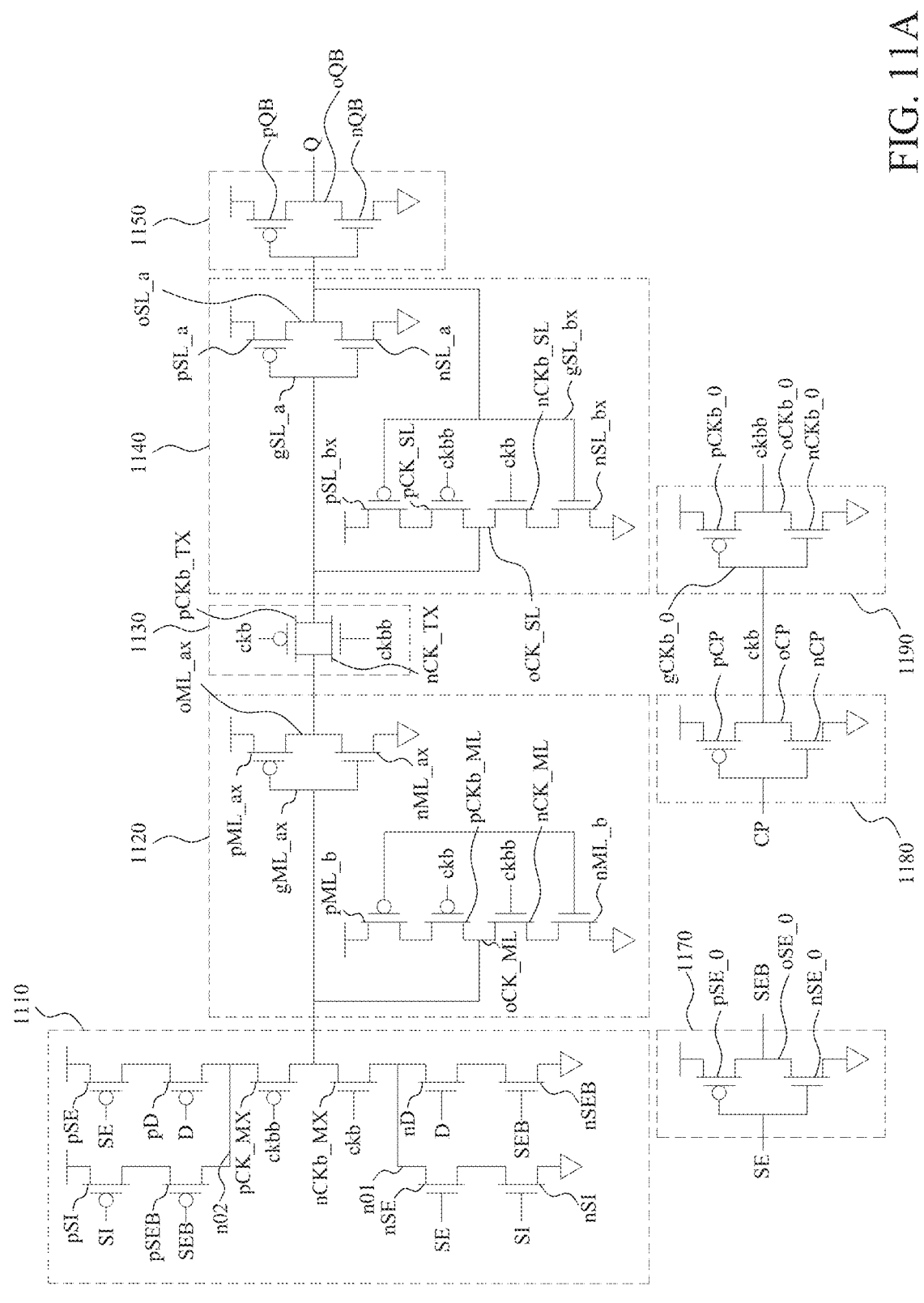
FIG. 11A is an equivalent circuit diagram of the SDF circuit in FIG. 10B, in accordance with some embodiments.

FIG. 10A are layout diagrams of a Scan D Flip-flop (SDF) circuit 1000, in accordance with some embodiments. FIG. 10B is a circuit diagram of the SDF circuit 1000 as specified by the layout diagrams in FIG. 10A, in accordance with some embodiments. FIG. 11A is an equivalent circuit diagram of the SDF circuit in FIG. 10B, in accordance with some embodiments. The circuit diagram in FIG. 10B closely tracks the physical locations of various elements (such as, the p-type transistors, the n-type transistors, the front-side signal lines, the back-side signal lines, and the via-connectors) in the layout diagram of FIG. 10A, while the circuit diagram in FIG. 11A groups the transistors in FIG. 10A into various functional blocks.

Figure 11B:
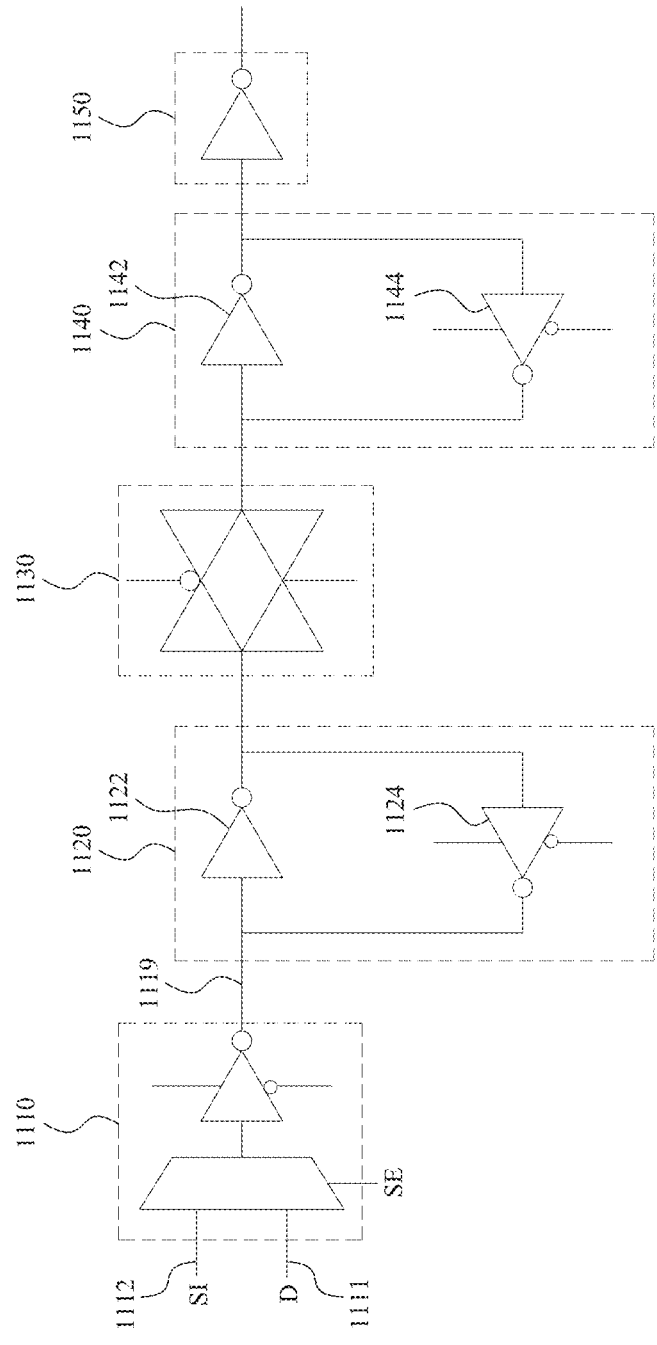
FIG. 11B is a circuit diagram of the SDF circuit represented in functional blocks, in accordance with some embodiments.

FIG. 11B is a circuit diagram of the SDF circuit 1000 represented in functional blocks, in accordance with some embodiments. In FIG. 11B, the SDF circuit 1000 includes a two-input multiplexer 1110, a master latch 1120, a transmission gate 1130, a slave latch 1140, and an inverter 1150. The two-input multiplexer 1110 receives a data signal D at a first input 1111 and a scan input signal SI at a second input 1112. Each of the two-input multiplexer 1110, the master latch 1120, and the slave latch 1140 is clocked by clock signals synchronized to the clock signal CP. Depending upon the logical levels of the selection enable signal SE, either the data signal D or the scan input signal SI is generated as an inverted signal at the output 1119 of the two-input multiplexer 1110. In some embodiments, the inverse of the data signal is generated at the at the output 1119 when the selection enable signal SE is at the logic HIGH, and the inverse of the scan input signal SI is generated at the at the output 1119 when the selection enable signal SE is at the logic LOW. The output 1119 of the two-input multiplexer 1110 is connected to the input of the master latch 1120. The transmission gate 1130 is connected between the master latch 1120 and the slave latch 1140. The output of the slave latch 1140 is connected to the input of the inverter 1150. The output of the SDF circuit 1000 is provided by the output of the inverter 1150.

In FIG. 10A, various elements for forming the SDF circuit 1000 are specified by the corresponding layout patterns. The layout diagram in FIG. 10A includes an upper portion of the layout and a lower portion of the layout. The elements specified by the upper portion of FIG. 10A includes a first p-type active-region semiconductor structure 52p and a second p-type active-region semiconductor structure 54p. The elements specified by the lower portion of FIG. 10A includes a first n-type active-region semiconductor structure 52n and a second n-type active-region semiconductor structure 54n. In the SDF circuit 1000 as specified by the layout diagram of FIG. 10A, various transistors are formed in the active-region semiconductor structures. The p-type transistors and the n-type transistors in the SDF circuit 1000 are listed in the Transistor Table in FIG. 10C according to the locations of the transistors in the layout diagram of FIG. 10A. The transistors in the first p-type active-region semiconductor structure 52p include the p-type transistors pQB, pSL_a, pSE_0, pSL_bx, pCK_SL, pCKb_TX, pML_ax, and pCP. The transistors in the second p-type active-region semiconductor structure 54p include the p-type transistors pSI, pSEB, pD, pSE, pCK_MX, pCKb_ML, pML_b, and pCKb_0. The transistors in the first n-type active-region semiconductor structure 52n include the n-type transistors nQB, nSL_a, nSE_0, nSL_bx, nCKb_SL, nCK_TX, nML_ax, and nCP. The transistors in the second n-type active-region semiconductor structure 54n include the n-type transistors nSI, nSEB, nD, nSE, nCKb_MX, pCK_ML, nML_b, and nCKb_0.

In the upper portion of FIG. 10A, each of the gate-conductors gQB, gSL_a, gSE, gSL_bx, gpCKbb, gpCKb, gML_ax, and gCP intersects the first p-type active-region semiconductor structure 52p at the channel region of a PMOS transistor and forms correspondingly the gate terminal of one of the p-type transistors pQB, pSL_a, pSE_0, pSL_bx, pCK_SL, pCKb_TX, pML_ax, and pCP. In the lower portion of FIG. 10A, each of the gate-conductors gQB, gSL_a, gSE, gSL_bx, gnCKb, gnCKbb, gML_ax, and gCP intersects the first n-type active-region semiconductor structure 52n at the channel region of an NMOS transistor and forms correspondingly the gate terminal of one of the n-type transistors nQB, nSL_a, nSE_0, nSL_bx, nCKb_SL, nCK_TX, nML_ax, and nCP. Each of the p-type transistors pQB, pSL_a, pSE_0, pSL_bx, pCK_SL, pCKb_TX, pML_ax, and pCP is correspondingly stacked with one of the n-type transistors nQB, nSL_a, nSE_0, nSL_bx, nCKb_SL, nCK_TX, nML_ax, and nCP.

In the upper portion of FIG. 10A, each of the gate-conductors gSI, gSEB, gD, gSE, gpCKbb, gpCKb, gML_b, and gCKb_0 intersects the second p-type active-region semiconductor structure 54p at the channel region of a PMOS transistor and forms correspondingly the gate terminal of one of the p-type transistors pSI, pSEB, pD, pSE, pCK_MX, pCKb_ML, pML_b, and pCKb_0. In the lower portion of FIG. 10A, each of the gate-conductors gSI, gSEB, gD, gSE, gnCKb, gnCKbb, gML_b, and gCKb_0 intersects the second n-type active-region semiconductor structure 54n at the channel region of an NMOS transistor and forms correspondingly the gate terminal of one of the n-type transistors nSI, nSEB, nD, nSE, nCKb_MX, nCK_ML, nML_b, and nCKb_0. Each of the p-type transistors pSI, pSEB, pD, pSE, pCK_MX, pCKb_ML, pML_b, and pCKb_0 is correspondingly stacked with one of the n-type transistors nSI, nSEB, nD, nSE, nCKb_MX, nCK_ML, nML_b, and nCKb_0.

In the SDF circuit 1000 as specified by the layout diagram of FIG. 10A, the gate terminals of the PMOS and the NMOS in each pair of the stacked transistors are conductively connected by a same gate-conductor shared by the PMOS and the NMOS, except for the PMOS and the NMOS in four pairs of stacked transistors related to the gate-conductors gpCKbb, gnCKb, gpCKb, and gnCKbb. The special symbols 885 (such as the triangle symbols) at the ends of the layout pattern for the gate-conductors bnCKb specify that the stacked gate-conductors gpCKbb and gnCKb are separated by a gate-stack insulator. The special symbols 885 (such as the triangle symbols) at the ends of the layout pattern for the gate-conductors gnCKbb specify that the stacked gate-conductors gpCKb and gnCKbb are separated by a gate-stack insulator. The gate terminals of each of the following four pairs of stacked transistors are not directly connected because of the gate-stack insulators: a first pair of stacked transistors pCK_SL and nCKb_SL, a second pair of stacked transistors pCKb_TX and nCK_TX, a third pair of stacked transistors pCK_MX and nCKb_MX, and a fourth pair of stacked transistors pCKb_ML and nCK_ML. In alternative embodiments, distinguishable layout patterns for the stacked gate-conductors gpCKbb and gnCKb are used to specify the separation of the stacked gate-conductors gpCKbb and gnCKb by a gate-stack insulator, and distinguishable layout patterns for the stacked gate-conductors gpCKb and gnCKbb are used to specify the separation of the stacked gate-conductors gpCKb and gnCKbb by a gate-stack insulator.

Additionally, the layout diagram in FIG. 10A also includes dummy gate-strips patterns 110 within the cell of the SDF cell and at the edges of the SDF cell. The intersections between dummy gate-strip patterns 110 and the layout pattern of the p-type active-region semiconductor structures (52p and 54p) specify the isolation regions in the p-type active-region semiconductor structure. The intersections between dummy gate-strip patterns 110 and the layout pattern of the n-type active-region semiconductor structures (52n and 54n) specify the isolation regions in the n-type active-region semiconductor structure. The isolation regions at the edges of the SDF cell electrically isolate the active regions in the SDF cell from the active-regions in the neighboring cells. Within the SDF cell, the dummy gate-strips pattern 110 intersecting the p-type active-region semiconductor structure 52p specifies an isolation region between the p-type transistors pSL_a and pSE_0, and the dummy gate-strips pattern 110 intersecting the p-type active-region semiconductor structure 54p specifies an isolation region between the p-type transistors pSE and pCK_MX, Within the SDF cell, the dummy gate-strips pattern 110 intersecting the n-type active-region semiconductor structure 52n specifies an isolation region between the n-type transistors nSL_a and nSE_0, and the dummy gate-strips pattern 110 intersecting the n-type active-region semiconductor structure 54n specifies an isolation region between the n-type transistors nSE and nCKb_MX, Each of the isolation regions in the active-region semiconductor structures (52p, 54p, 52n or 54n) is identified as CPODE in the Transistor Table of FIG. 10C. The CPODE in the Transistor Table of FIG. 10C suggest that the continuous poly on oxide definition (CPODE) technology is one possible technology for creating the isolation regions in the active-region semiconductor structures (52p, 54p, 52n or 54n). Other suitable technologies, such as the poly on oxide definition edge (PODE) technology, are also within the contemplated scope of the present disclosure.

In the upper portion of FIG. 10A, each of the conductive segments C31p-C39p and C30p intersects the first p-type active-region semiconductor structure 52p at a terminal region of at least one of the p-type transistors pQB, pSL_a, pSE_0, pSL_bx, pCK_SL, pCKb_TX, pML_ax, and pCP. Each of the conductive segments C71p-C79p and C70p intersects the second p-type active-region semiconductor structure 54p at a terminal region of at least one of the p-type transistors pSI, pSEB, pD, pSE, pCK_MX, pCKb_ML, pML_b, and pCKb_0. In addition to the gate-conductors and the conductive segments intersecting the p-type active-region semiconductor structures (52p and 54p), as specified in the upper portion of FIG. 10A, the SDF circuit 1000 also includes the front-side signal lines (F22, F24, F26, F28, F42, F44, F62, F64, F66, F68, F82, F84, and F86) and the front-side power rails (32F and 34F).

In the lower portion of FIG. 10A, each of the conductive segments C31n-C39n and C30n intersects the first n-type active-region semiconductor structure 52n at a terminal region of at least one of the n-type transistors nQB, nSL_a, nSE_0, nSL_bx, nCKb_SL, nCK_TX, nML_ax, and nCP. Each of the conductive segments C71n-C79n and C70n intersects the second n-type active-region semiconductor structure 54n at a terminal region of at least one of the n-type transistors nSI, nSEB, nD, nSE, nCKb_MX, nCK_ML, nML_b, and nCKb_0. In addition to the gate-conductors and the conductive segments intersecting the n-type active-region semiconductor structures (52n and 54n), as specified in the lower portion of FIG. 10A, the SDF circuit 1000 also includes the back-side signal lines (B22, B24, B26, B42, B44, B46, B62, B64, B66, B82, B84, and B86) and the back-side power rails (32B and 34B).

The conductive connections between the various elements of the SDF circuit 1000 are depicted in both the layout diagram of FIG. 10A and the circuit diagrams of FIGS. 11A-11B. Each of the conductive segments C32p, C35p, and C39p is connected to the first front-side power rail 32F through a corresponding top via-connector VT. Each of the conductive segments C71p, C75p, and C79p is connected to the second front-side power rail 34F through a corresponding top via-connector VT. Each of the conductive segments C32n, C35n, and C39n is connected to the first back-side power rail 32B through a corresponding bottom via-connector VB. Each of the conductive segments C72n and C79n is connected to the second back-side power rail 34B through a corresponding bottom via-connector VB.

In FIG. 10A, the stacked conductive segments C31p and C31n are conductively connected through a corresponding conductive-segment inter-connector VMD while forming a signal-out node oQB. The stacked conductive segments C33p and C33n are conductively connected through a corresponding conductive-segment inter-connector VMD while forming a signal-out node oSL_a. The stacked conductive segments C34p and C34n are conductively connected through a corresponding conductive-segment inter-connector VMD while forming a signal-out node oSE_0. The stacked conductive segments C37p and C37n are conductively connected through a corresponding conductive-segment inter-connector VMD while forming a signal-out node oCK_SL. The stacked conductive segments C77p and C77n are conductively connected through a corresponding conductive-segment inter-connector VMD while forming a signal-out node oCK_MX and a signal-out node oCK_ML. The stacked conductive segments C38p and C38n are conductively connected through a corresponding conductive-segment inter-connector VMD while forming a signal-out node oML_ax. The stacked conductive segments C30p and C30n are conductively connected through a corresponding conductive-segment inter-connector VMD while forming a signal-out node oCP. The stacked conductive segments C70p and C70$n$ are conductively connected through a corresponding conductive-segment inter-connector VMD while forming a signal-out node oCKb_0. The signal-out nodes (oQB, oSL_a, oSE_0, oCK_SL, oCK_MX, oCK_ML, oML_ax, oCP, and oCKb_0) in the layout diagram of FIG. 10A are also identified and labeled in the circuit diagrams of FIG. 10B and FIG. 11A.

The elements specified by the layout diagram of FIG. 10A include various via connectors. When a top gate-via-connector VG is placed at an intersection of a front-side signal line and a gate-conductor, the top gate-via-connector VG specifies that the front-side signal line is directly connected to the gate-conductor. When a via-connector VT is placed at an intersection of a front-side signal line and a conductive segment, the via-connector VT specifies that the front-side signal line is directly connected to the conductive segment. When a bottom gate-via-connector VG is placed at an intersection of a back-side signal line and a gate-conductor, the bottom gate-via-connector VG specifies that the back-side signal line is directly connected to the gate-conductor. When a via-connector VB is placed at an intersection of a back-side signal line and a conductive segment, the via-connector VB specifies that the back-side signal line is directly connected to the conductive segment.

In FIGS. 10A-10B, the front-side signal line F42 is directly connected to the gate-conductors gQB and gSL bx and to the conductive segment C33$p$. The front-side signal line F64 is directly connected to each of the conductive segments C73$p$ and C76$p$. For transmitting an inverted clock signal ckb to the gate-conductor gpCKb from the signal-out node oCP, the front-side signal line F44 is directly connected to the gate-conductor gpCKb and the conductive segment C30$p$. For transmitting a clock signal ckbb to the gate-conductor gpCKbb from the signal-out node oCKb_0, the front-side signal line F86 is directly connected to the gate-conductor gpCKbb and the conductive segment C70$p$. For connecting the signal-out node oSE_0 to the gate-conductor gSEB, the front-side signal line F22 is directly connected to the conductive segment C34$p$, and the front-side signal line F82 is directly connected to the gate-conductor gSEB, while the front-side signal lines F22 and F82 are conductively connected together through a conductive routing line M1_1 extending in the Y-direction. For connecting the signal-out nodes oCK_MX and oCK_ML to the gate-conductor gML_ax, the front-side signal line F26 is directly connected to the gate-conductor gML_ax, and the front-side signal line F66 is directly connected to the conductive segment C77$p$, while the front-side signal lines F26 and F66 are conductively connected together through a conductive routing line M1_2 extending in the Y-direction.

In the IC device as specified by the layout diagram of FIG. 10A, the conductive routing lines M1_1 and M1_2 are routing lines in a conductive layer (such as, an M1 layer) that is separated from the front-side conductive layer by an insulation layer. Each of the front-side signal lines F22 and F82 is directly connected to the conductive routing line M1_1 through a corresponding via-connector VITA0 passing through the insulation layer. Each of the front-side signal lines F26 and F66 is directly connected to the conductive routing line M1_2 through a corresponding via-connector VITA0 passing through the insulation layer. In the layout diagram in FIG. 10A, while the via-connectors VITA0 are represented by corresponding layout patterns, the conductive routing lines M1_1 and M1_2 are only represented by "stick" lines to improve the readability of the layout diagram. In alternative embodiments of the layout diagram in FIG. 10A, in addition to the via-connectors VITA0, each of the conductive routing lines M1_1 and M1_2 is also represented by a corresponding layout pattern, which specifies not only the location but also the geometry (such as the width and the length) of the represented conductive routing line.

In FIGS. 10A-10B, the back-side signal line B24 is directly connected to the gate-conductor gSL a and the conductive segment C37$n$. The back-side signal line B64 is directly connected to the conductive segments C74$n$ and C76$n$. The back-side signal line B82 is directly connected to the conductive segments C7 1$n$ and C75$n$. For transmitting an inverted clock signal ckb to the gate-conductor gnCKb from the signal-out node oCP, the back-side signal line B46 is directly connected to the gate-conductor gnCKb and the conductive segment C30$n$. For transmitting a clock signal ckbb to the gate-conductor gnCKbb from the signal-out node oCKb_0, the back-side signal line B66 is directly connected to the gate-conductor gnCKbb and the conductive segment C70$n$. For connecting the signal-out node oML_ax to the gate-conductor gML_b, the back-side signal line B26 is directly connected to the conductive segment C38$n$, and the back-side signal line B84 is directly connected to the gate-conductor gML_b, while the back-side signal lines B26 and B84 are conductively connected together through a conductive routing line N1_1 extending in the Y-direction. For connecting the signal-out node oCP to the gate-conductor gCKb_0, the back-side signal line B86 is directly connected to the gate-conductor gCKb_0, while the back-side signal line B86 is conductively connected to the back-side signal line B46 through a conductive routing line N1_2 extending in the Y-direction.

In the IC device as specified by the layout diagram of FIG. 10A, the conductive routing lines N1_1 and N1_2 are routing lines in another back-side conductive layer that is separated from the back-side conductive layer by insulation materials. Each of the back-side signal lines B26 and B84 is directly connected to the conductive routing line N1_1 through a corresponding back-side via-connector VIA0 passing through the insulation materials. Each of the back-side signal lines B46 and B86 is directly connected to the conductive routing line N1_2 through a corresponding back-side via-connector VIA0 passing through the insulation materials. In the layout diagram in FIG. 10A, while the back-side via-connectors VIA0 are represented by corresponding layout patterns, the conductive routing lines N1_1 and N1_2 are only represented by "stick" lines to improve the readability of the layout diagram. In alternative embodiments of the layout diagram in FIG. 10A, in addition to the back-side via-connectors VIA0, each of the conductive routing lines N1_1 and N1_2 is also represented by a corresponding layout pattern, which specifies not only the location but also the geometry (such as the width and the length) of the represented conductive routing line.

Additionally, in FIGS. 10A-10B, the front-side signal line F62 is directly connected to the gate-conductor gSI and functions as an input signal line for the Scan Input signal "SI". The front-side signal line F84 is directly connected to the gate-conductor gD and functions as an input signal line for the Input Data "D" of the SDF circuit 1000. The front-side signal line F28 is directly connected to the gate-conductor gCP and functions as an input signal line for the clock signal "CP". The back-side signal line B44 is directly connected to the gate-conductor gSE and functions as an input signal line for the Scan Enable signal "SE." The back-side signal line B22 is directly connected to the conductive segments C31$n$ and functions as an output signal line for the Output Data "Q" of the SDF circuit 1000.

The circuit diagram in FIG. 10B closely tracks the physical locations of various elements (such as, the transistors, the routing tracks, and via connectors) in the layout diagram of FIG. 10A, while the circuit diagram in FIG. 11A groups the transistors in FIG. 10B into various functional blocks.

In FIG. 11A and FIG. 11B, five p-type transistors (pSI, pSEB, pSE, pD, and pCK_MX) and five n-type transistors (nSI, nSE, nSEB, nD, and nCK_MX) are used for forming the two-input multiplexer 1110 (as shown in FIG. 11B). The p-type transistor pML_ax and the n-type transistor nML_ax form an inverter 1122 in the master latch 1120. Two p-type transistors (pML_b and pCKb_ML) and two n-type transistors (nML_b and nCK_ML) form a clocked inverter 1124 in the master latch 1120. The p-type transistor pCKb TX and the n-type transistor nCK_TX form the transmission gate 1130. The p-type transistor pSL a and the n-type transistor nSL_a form an inverter 1142 in the slave latch 1140. Two p-type transistors (pSL_bx and pCK_SL) and two n-type transistors (nSL_bx and nCKb_SL) form a clocked inverter 1144 in the master latch 1140. The p-type transistor pQB and the n-type transistor nQB form the inverter 1150.

In FIG. 11A and FIG. 11B, the p-type transistor pSE_0 and the n-type transistor nSE_0 form an inverter 1170 for generating an inverted selection enable signal SEB from the selection enable signal SE. The selection enable signal SE is coupled to the gate terminals of the p-type transistor pSE and the n-type transistor nSE. The p-type transistor pCP and the n-type transistor nCP form an inverter 1180 for generating an inverted clock signal ckb from the clock signal CP. The p-type transistor pCKb_0 and the n-type transistor nCKb_0 form an inverter 1190 for generating a clock signal ckbb from the inverted clock signal ckb. The inverted clock signal ckb is couple to the gate terminals of the p-type transistors pCKb_TX and pCKb_ML and the gate terminals of the n-type transistors nCKb_SL and nCKb_MX. The clock signal ckbb is couple to the gate terminals of the p-type transistors pCK_SL and pCK_MX and the gate terminals of the n-type transistors nCK_TX and nCK_ML.

The various IC devices (e.g., 100-600 and 800-1000), as described in the present disclosure, have improved power connections from the source terminals of PMOS and NMOS transistors to the corresponding supply voltages, when compared with some alternatives in other implementations of the power rails. In general, when the first supply voltage VDD is provided by the front-side power rail 30F in the front-side conductive layer and the second supply voltage VSS is provided by the back-side power rail 30B in the back-side conductive layer, it is possible to connect the source terminals of PMOS and NMOS transistors to the corresponding supply voltages with reduced source resistance. Specifically, when the first supply voltage VDD is provided by the front-side power rail 30F, the source terminal of the PMOS transistor is connected to the first supply voltage VDD by connecting the source conductive segment of the PMOS transistor to the front-side power rail 30F through a top via-connector VT. When the second supply voltage VSS is provided by the back-side power rail 30B, the source terminal of the NMOS transistor is connected to the second supply voltage VSS by connecting the source conductive segment of the NMOS transistor to the back-side power rail 30B through a bottom via-connector VB.

In contrast, in some alternative implementations, if both the first supply voltage VDD and the second supply voltage VSS are provided in the back-side conductive layer, then, the source conductive segment of the PMOS transistor needs to be connected to the power rail for VDD though a top-to-bottom via-connector VTB. Because the electric resistance of the top-to-bottom via-connector VTB is larger than the electric resistance of the top via-connector VT (mainly due to the length difference), the connection from the source terminal of the PMOS transistor to a power rail in the back-side conductive layer (as in the alternative implementations) has larger resistivity than the connection from the source terminal of the PMOS transistor to the front-side power rail 30F (as descried in the present disclosure). Similarly, in some alternative implementations, if both the first supply voltage VDD and the second supply voltage VSS are provided in the front-side conductive layer, then, the source conductive segment of the NMOS transistor needs to be connected to the power rail for VSS though a bottom-to-top via-connector VBT. Because the electric resistance of bottom-to-top via-connector VBT is larger than the electric resistance of the bottom via-connector VB (mainly due to the length difference), the connection from the source terminal of the NMOS transistor to a power rail in the front-side conductive layer (as in the alternative implementations) has larger resistivity than the connection from the source terminal of the NMOS transistor to the back-side power rail 30B (as descried in the present disclosure).

Figure 12A:
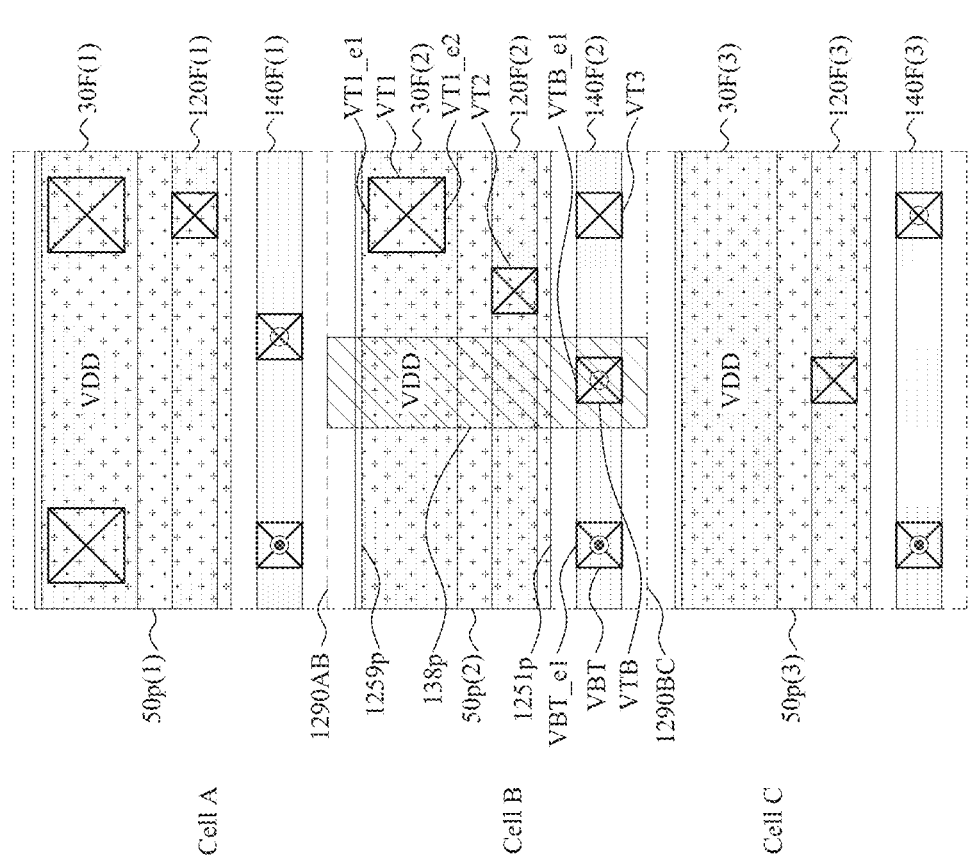

In addition to improving the power connections for both the PMOS transistors and the NMOS transistors, the front-side power rails also provide inter-cell signal shielings for the front-side signal lines and the back-side power rails also provide inter-cell signal shielings for the back-side signal lines when multiple IC cells are positioned in a column (extending the Y-direction). FIG. 12A and FIG. 12B are correspondingly the upper portion and the lower portion of a layout diagram of a multi-cell circuit 1200, in accordance with some embodiments. The multi-cell circuit 1200 includes at least three IC cells (e.g., Cell A, Cell B, and Cell C) positioned next to each other in a column extending in the Y-direction. The Cell A and the Cell B share a common cell boundary 1290AB, and the Cell B and the Cell C shares a common cell boundary 1290BC. Each of the Cell A, Cell B, and Cell C includes a p-type active-region semiconductor structure, which is correspondingly 50$p$(1), 50$p$(2), and 50$p$(3) as shown in FIG. 12A. Each of the Cell A, Cell B, and Cell C includes an n-type active-region semiconductor structure, which is correspondingly 50$n$(1), 50$n$(2), and 50$n$(3) as shown in FIG. 12B.

In FIGS. 12A-12B, each of the IC cells in the multi-cell circuit 1200 is associated with a corresponding front-side power rail for providing the first power supply VDD. For example, each of the Cell A, the Cell B, and the cell C is correspondingly associated with one of the front-side power rails 30F(1), 30F(2), and 30F(3). Each of the IC cells in the multi-cell circuit 1200 is associated with a corresponding back-side power rail for providing the second power supply VSS. For example, each of the Cell A, the Cell B, and the cell C is correspondingly associated with one of the back-side power rails 30B(1), 30B(2), and 30B(3).

Each of the front-side power rails 30F(1), 30F(2), and 30F(3) is effectively a "signal ground" when each of the front-side power rails is maintained at a constant power supply voltage VDD. Consequently, each of the front-side power rails reduces the stray capacitive couplings between the front-side signal lines in the neighboring IC cells. For example, the stray capacitive couplings between the front-side signal lines 120F(1)/140F(1) in the Cell A and the front-side signal lines 120F(2)/140F(2) in the Cell B are reduced by the front-side power rail 30F(2). The stray capacitive couplings between the front-side signal lines 120F(2)/140F(2) in the Cell B and the front-side signal lines 120F(3)/140F(3) in the Cell C are reduced by the front-side power rail Similarly, each of the back-side power rails 30B(1), 30B(2), and 30B(3) is effectively a "signal ground" when each of the back-side power rails is maintained at a constant power supply voltage VSS. Consequently, each of the back-side power rails reduces the stray capacitive couplings between the back-side signal lines in the neighboring IC cells. For example, the stray capacitive couplings between the back-side signal lines 120B(1)/140B(1) in the Cell A and the back-side signal lines 120B(2)/140B(2) in the Cell B are reduced by the back-side power rail The stray capacitive couplings between the back-side signal lines 120B(2)/140B(2) in the Cell B and the back-side signal lines 120B(3)/140B(3) in the Cell C are reduced by the back-side power rail 30B(3).

In the various IC devices (e.g., 100-600, 800-1000, and 1200) as described in the present disclosure, each IC cell is powered by a front-side power rail and a back-side power rail, and each IC cell is also provided with both front-side signal lines and the back-side signal lines for signal routings. The maximally allowable widths (along the Y-direction) of the active-region semiconductor structures in the various IC devices (e.g., 100-600, 800-1000, and 1200, as described in the present disclosure) is larger than the maximally allowable widths in some alternatives implementations of the signal lines and the power rails.

For example, in each embodiment of the inverters 100-600, for at least the reason that both the front-side signal line 120F and the back-side signal line 120B are available in stacked position, it is possible for the width of the p-type active-region semiconductor structure 50p to extend along the negative Y-direction beyond the edges of the front-side signal lines 120F, and it is possible for the width of the n-type active-region semiconductor structure 50n to extend along the negative Y-direction beyond the edges of the back-side signal lines 120B. Specifically, the width of the p-type active-region semiconductor structure 50p is not limited by any bottom-to-top via-connector VBT for connecting a source/drain terminal of the NMOS to the front-side signal line 120F. The width of the n-type active-region semiconductor structure 50n is not limited by a top-to-bottom via-connector VTB for connecting a source/drain terminal of the PMOS to the back-side signal line 120B.

Taking the Cell B in FIG. 12A as an example, it is possible to expand the width of the p-type active-region semiconductor structure 50p(2) to the extend such that both the two edges of the front-side signal line 120F(2) are positioned in parallel between the first edge 1251p and the second edge 1259p of the p-type active-region semiconductor structure 50p(2). In fact, it is possible to expand the width of the p-type active-region semiconductor structure 50p(2) until the first edge 1251p of the active-region semiconductor structure 50p(2) reaches an edge VBT el of the bottom-to-top via-connector VBT. The bottom-to-top via-connector VBT in the Cell B conductively connects the front-side signal line 140F(2) with a conductive segment (such as, 136n in FIG. 12B) intersecting the n-type active-region semiconductor structure 50n(2).

Taking the Cell B in FIG. 12B as an example, it is possible to expand the width of the n-type active-region semiconductor structure 50n(2) to the extent such that both of the two edges of the front-side signal line 120B(2) are positioned in parallel between the first edge 1251n and the second edge 1259n of the n-type active-region semiconductor structure 50n(2). In fact, it is possible to expand the width of the n-type active-region semiconductor structure 50n(2) until the first edge 1251n of the active-region semiconductor structure 50n(2) reaches an edge VBT el of the top-to-bottom via-connector VTB. The top-to-bottom via-connector VTB in the Cell B conductively connects the front-side signal line 140B(2) with a conductive segment (such as 138p in FIG. 12A) intersecting the p-type active-region semiconductor structure 50p(2).

Additionally, in each embodiment of the inverters 100-600, there is not a bottom-to-top via-connector VBT for connecting a source terminal of the NMOS to a power rail in the front-side conductive layer. Consequently, it is possible for the width of the active-region semiconductor structure 50p to extend along the positive Y-direction beyond the edges of the power rail in the front-side conductive layer, if the width extension of the active-region semiconductor structure 50p along the positive Y-direction is not limited by other factors (such as design rules related to the neighboring cell). In each embodiment of the inverters 100-600, there is also no top-to-bottom via-connector VTB for connecting a source terminal of the PMOS to a power rail in the back-side conductive layer. Consequently, it is possible for the width of the active-region semiconductor structure 50n to extend along the positive Y-direction beyond the edges of the power rail in the back-side conductive layer, if the width extension of the active-region semiconductor structure 50p along the positive Y-direction is not limited by other factors (such as design rules related to neighboring cells).

Taking the Cell B in FIGS. 12A-12B as an example, because there is no bottom-to-top via-connector VBT underneath the front-side power rail 30F(2), it is possible to expand the width of the p-type active-region semiconductor structure 50p(2) to the extent such that the two edges of the front-side power rail 30F(2) are both positioned in parallel between the first edge 1251p and the second edge 1259p of the p-type active-region semiconductor structure 50p(2). Similarly, because there is no top-to-bottom via-connector VTB positioned above the back-side power rail it is possible to expand the width of the n-type active-region semiconductor structure such that the two edges of the back-side power rail 30B(2) are both positioned in parallel between the first edge 1251n and the second edge 1259n of the n-type active-region semiconductor structure 50n(2).

In some alternative embodiments, even if two or more front-side signal lines (not shown in the figure) are implemented between the front-side power rail 30F(2) and the front-side signal line 140F(2), the bottom-to-top via-connector VBT in the Cell B are still only implemented for the front-side signal line 140F(2) to conductively connect the front-side signal line 140F(2) with a conductive segment (such as, 136n in FIG. 12B) intersecting the n-type active-region semiconductor structure 50n(2). In the alternative embodiments, no bottom-to-top via-connector VBT is implemented for the other two or more front-side signal lines that are between the front-side power rail 30F(2) and the front-side signal line 140F(2), and no bottom-to-top via-connector VBT is implemented to conductively connect the other two or more front-side signal lines with the conductive segment (such as, 136n in FIG. 12B) intersecting the n-type active-region semiconductor structure 50n(2). That is, in the alternative embodiments, the distance between each bottom-to-top via-connector VBT to the cell boundary 1290BC is minimized to maximize the width of the p-type active-region semiconductor structure 50p(2), and bottom-to-top via-connectors VBT are only implemented for the front-side signal line, such as 140F(2), that is adjacent to the cell boundary extending in the X-direction.

In some alternative embodiments, even if two or more back-side signal lines (not shown in the figure) are implemented between the back-side power rail 30B(2) and the back-side signal line 140B(2), the top-to-bottom via-connector VTB in the Cell B are still only implemented for the back-side signal line 140B(2) to conductively connect the back-side signal line 140B(2) with a conductive segment (such as, 136*p* in FIG. 12A) intersecting the p-type active-region semiconductor structure 50*p*(2). In the alternative embodiments, no top-to-bottom via-connector VTB is implemented for the other two or more back-side signal lines that are between the back-side power rail 30B(2) and the back-side signal line 140B(2), and no top-to-bottom via-connector VTB is implemented to conductively connect the other two or more back-side signal lines with the conductive segment (such as, 136*p* in FIG. 12A) intersecting the n-type active-region semiconductor structure 50*n*(2). That is, in the alternative embodiments, the distance between each top-to-bottom via-connector VTB to the cell boundary 1290BC is minimized to maximize the width of the n-type active-region semiconductor structure 50*n*(2), and top-to-bottom via-connectors VTB are only implemented for the back-side signal line, such as 140B(2), that is adjacent to the cell boundary extending in the X-direction.

FIG. 13 are layout diagrams of a circuit cell having labeled dimensions, in accordance with some embodiments. The dimensions of the front-side power rail, the front-side signal line, and the top via-connectors are labeled in the upper portion of FIG. 13. The dimensions of the back-side power rail, the back-side signal line, and the bottom via-connectors are labeled in the lower portion of FIG. 13. The dimensions of the bottom-to-top via-connector and the top-to-bottom via-connector are labeled in both the upper portion and the lower portion of FIG. 13.

In the upper portion of FIG. 13, the width Wa of the front-side signal line 120F is in a range from 1.0 to 1.5 times of the minimal metal width in the wafer. The width Wb of the front-side power rail 30F is in a range from 0.8 to 5.0 times of the width Wa. The width Wc of the front-side signal line 140F is in a range from 0.8 to 1.5 times of the width Wa. The width We of the front-side signal line 160F is in a range from 0.8 to 2.0 times of the width Wa. In some embodiments, the lower limit of the width Wa is usually determined by the photolithography capability at the technology node of interests. In some embodiments, the upper limit of the width Wa is usually determined by the number of routing line requirements. Increasing the width Wa reduces the number of routing lines available for each cell, which increases the cell areas, in some embodiments.

In the upper portion of FIG. 13, the top via-connector VT1 connects front-side power rail 30F to a conductive segment, the top via-connector VT2 connects the front-side signal line 120F to a conductive segment, and the top via-connector VT3 connects the front-side signal line 160F to a conductive segment. The width "(a)" of the top via-connector VT2 is in a range from 1.0 to 1.5 times the minimal via width in the wafer, and the length "(b)" of the top via-connector VT2 is in a range from 1.0 to 1.5 times the minimal via length in the wafer. The width "(c)" of the top via-connector VT1 is in a range from 0.8 to 2.0 times the width "(a)", and the length "(d)" of the top via-connector VT1 is in a range from 0.8 to 5.0 times the length "(b)". The width "(i)" of the top via-connector VT3 is in a range from 0.8 to 2.0 times the width "(a)", and the length "(j)" of the top via-connector VT3 is in a range from 0.8 to 2.0 times the length "(b)".

In the upper portion of FIG. 13, the bottom-to-top via-connector VBT connects the front-side signal line 140F to a conductive segment for the transistor in the bottom of a CFET transistor stack, and the top-to-bottom via-connector VTB connects the conductive segment for the transistor in the top of a CFET transistor stack to the back-side signal line 140B (which is shown in the lower portion of FIG. 13).

The upper end of the bottom-to-top via-connector VBT is in contact with the front-side signal line 140F. The upper end of the top-to-bottom via-connector VTB is in contact with a conductive segment. The width "(e)" of the bottom-to-top via-connector VBT at the upper end is in a range from 0.8 to 1.5 times the width "(a)", and the length "(g)" of the bottom-to-top via-connector VBT at the upper end is in a range from 0.8 to 1.5 times the length "(b)". The width "(f)" of the top-to-bottom via-connector VTB at the upper end is in a range from 0.8 to 1.5 times the width "(a)", and the length "(h)" of the top-to-bottom via-connector VTB at the upper end is in a range from 0.8 to 1.5 times the length "(b)".

In some embodiments, the lower limits of the width "(a)" and the length "(b)" are usually determined by the reliability requirements and IR drop requirements at the technology node of interests. If the width "(a)" or the length "(b)" becomes too small, via-hole failure rates increase during fabrication due to the increased chance that some of the via holes for accommodating the top via-connectors are not completely opened up. Additionally, if the width "(a)" or the length "(b)" becomes too small, the IR drops of the top via-connectors increases, which may influence the reliability and the performance of the integrated circuits fabricated. In some embodiments, if the width "(a)" or the length "(b)" become too large, the number of available via-connectors or the number of available routing lines for each cell decreases, which increases the cell areas.

In the lower portion of FIG. 13, the width Wa' of the back-side signal line 120B is in a range from 1.0 to 1.5 times the minimal metal width in the wafer. The width Wb' of the back-side power rail 30B is in a range from 0.8 to 5.0 times the width Wa'. The width Wc' of the back-side signal line 140B is in a range from 0.8 to 1.5 times the width Wa'. The width We of the back-side signal line 160B is in a range from 0.8 to 2.0 times the width Wa'. In some embodiments, the lower limit of the width Wa' is determined by the photolithography capability at the technology node of interest. In some embodiments, the upper limit of the width Wa' is determined by the number of routing line requirements. In some embodients, increasing the width Wa' reduces the number of routing lines available for each cell, which increases the cell areas.

In the lower portion of FIG. 13, the bottom via-connector VB1 connects back-side power rail 30B to a conductive segment, the bottom via-connector VB2 connects the back-side signal line 120B to a conductive segment, and the bottom via-connector VB3 connects the back-side signal line 160B to a conductive segment. The width "(a')" of the bottom via-connector VB2 is in a range from 1.0 to 1.5 times the minimal via width in the wafer, and the length "(b')" of the bottom via-connector VB2 is in a range from 1.0 to 1.5 times the minimal via length in the wafer. The width "(c')" of the bottom via-connector VB1 is in a range from 0.8 to 2.0 times the width "(a')", and the length "(d')" of the bottom via-connector VB1 is in a range from 0.8 to 5.0 times the length "(b')". The width "(i')" of the bottom via-connector VB3 is in a range from 0.8 to 2.0 times the width "(a')", and the length "(j')" of the bottom via-connector VB3 is in a range from 0.8 to 2.0 times the length "(b')".

In the lower portion of FIG. 13, the lower end of the bottom-to-top via-connector VBT is in contact with a conductive segment, and the lower end of the top-to-bottom via-connector VTB is in contact with the back-side signal line 140B. The width "(e')" of the bottom-to-top via-connector VBT at the lower end is in a range from 0.8 to 1.5 times the width "(a')", and the length "(g')" of the bottom-to-top via-connector VBT at the lower end is in a range from 0.8 to 1.5 times the length "(b')". The width "(f')" of the top-to-bottom via-connector VTB at the lower end is in a range from 0.8 to 1.5 times the width "(a')", and the length "(h')" of the top-to-bottom via-connector VTB at the lower end is in a range from 0.8 to 1.5 times the length "(b')".

In some embodiments, the lower limits of the width "(a')" and the length "(b')" are determined by the reliability requirements and IR drop requirements at the technology node of interest. If the width "(a') " or the length "(b')" becomes too small, via-hole failure rates increase during fabrication due to the increase chances that some of the via holes for accommodating the top via-connectors are not completely opened up. Additionally in some embodiments, if the width "(a')" or the length "(b')" becomes too small, the IR drops of the top via-connectors increases, which influences the reliability and the performance of the integrated circuits fabricated. In some embodiments, if the width "(a') " or the length "(b')" become too large, the number of available via-connectors or the number of available routing lines for each cell decreases, which increases the cell areas.

FIG. 14 is a flowchart of a method 1400 of generating an integrated circuit (IC) layout diagram, in accordance with some embodiments. It is understood that additional operations may be performed before, during, and/or after the method 1400 depicted in FIG. 14, and that some other processes may only be briefly described herein. In some embodiments, the method 1400 is usable to generate one or more layout designs, such as the layout designs in FIG. 10A or FIGS. 12A-12B. In some embodiments, the method 1400 is usable to form integrated circuits having similar structural relationships as one or more of the semiconductor structures formed based on the layout designs in FIG. 10A or FIGS. 12A-12B. In some embodiments, method 1400 is performed by a processing device (e.g., processor 1602 in FIG. 16) configured to execute instructions for generating one or more layout designs, such as the layout designs in in FIG. 10A or FIGS. 12A-12B.

In operation 1402 of method 1400, an array of front-side power rail patterns is generated. Each of the front-side power rail patterns specifies a front-side power rail in a front-side conductive layer. In the example layout designs of FIGS. 12A-12B, the array of front-side power rail patterns includes the layout patterns for the front-side power rails 30F(1), 30F(2), and 34F(3). After operation 1402, the flow proceeds to operation 1404.

In operation 1402 of method 1400, an array of first-type active zone patterns is generated. The first-type active zone patterns are positioned in parallel with the front-side power rail patterns. Each of the first-type active zone patterns specifies a first-type active-region semiconductor structure. In the example layout designs of FIGS. 12A-12B, the array of first-type active zone patterns includes the layout patterns for the p-type active-region semiconductor structures 50p(1), 50p(2), and 50p(3). The layout patterns for the p-type active-region semiconductor structures 50p(1), 50p(2), and 50p(3) are positioned in parallel between the layout patterns for the front-side power rails 30F(1), 30F(2), and 34F(3). After operation 1404, the flow proceeds to operation 1406.

In operation 1406 of method 1400, an array of back-side power rail patterns is generated. Each back-side power rail pattern specifies a back-side power rail in a back-side conductive layer. In the example layout designs of FIGS. 12A-12B, the array of back-side power rail patterns includes the layout patterns for the back-side power rails 30B(1), 30B(2), and 34B(3). After operation 1406, the flow proceeds to operation 1408.

In operation 1406 of method 1400, an array of second-type active zone patterns is generated. The second-type active zone patterns are positioned in parallel with the back-side power rail patterns. Each of the second-type active zone patterns specifies a second-type active-region semiconductor structure that is stacked with a corresponding first-type active-region semiconductor structure. In the example layout designs of FIGS. 12A-12B, the array of second-type active zone patterns includes the layout patterns for the n-type active-region semiconductor structures 50n(1), 50n(2), and 50n(3). In the integrated circuit fabricated according to the layout designs of FIGS. 12A-12B, the n-type active-region semiconductor structures 50n(1) is staked with the p-type active-region semiconductor structures 50p(1), the n-type active-region semiconductor structures 50n(2) is staked with the p-type active-region semiconductor structures 50p(2), and the n-type active-region semiconductor structures 50n(3) is staked with the p-type active-region semiconductor structures 50p(3). After operation 1408, the flow proceeds to operation 1410.

In operation 1410 of method 1400, at least one front-side signal line pattern is generated between a pair of adjacent front-side power rail patterns. The at least one front-side signal line pattern specifies a front-side signal line in the front-side conductive layer above both the first-type active-region semiconductor structure and the second-type active-region semiconductor structure. In the example layout designs of FIGS. 12A-12B, the layout patterns for the front-side signal lines 120F(1) and 140F(1) are positioned between the layout patterns for the front-side power rails and 30F(2). The layout patterns for the front-side signal lines 120F(2) and 140F(2) are positioned between the layout patterns for the front-side power rails 30F(2) and 30F(3). After operation 1410, the flow proceeds to operation 1412.

In operation 1412 of method 1400, at least one back-side signal line pattern is generated between a pair of adjacent back-side power rail patterns. The at least one back-side signal line pattern specifies a back-side signal line in the back-side conductive layer below both the first-type active-region semiconductor structure and the second-type active-region semiconductor structure. In the example layout designs of FIGS. 12A-12B, the layout patterns for the back-side signal lines 120B(1) and 140B(1) are positioned between the layout patterns for the back-side power rails and 30B(2). The layout patterns for the back-side signal lines 120B(2) and 140B(2) are positioned between the layout patterns for the back-side power rails 30B(2) and 30B(3).

FIG. 15 is a flowchart of a method 1500 of manufacturing an integrated circuit (IC) having CFET devices, in accordance with some embodiments. It is understood that additional operations may be performed before, during, and/or after the method 1500 depicted in FIG. 15, and that some other processes may only be briefly described herein.

In operation 1510 of method 1500, a second-type active-region semiconductor structure is fabricated on a substrate. Then, in operation 1512 of method 1500, a second gate-conductor is fabricated and the second gate-conductor intersects the second-type active-region semiconductor structure. As a non-limiting example, in the embodiments as shown in FIG. 1A and FIGS. 1C-1E, the n-type active-region semiconductor structure 50n is fabricated on a substrate in operation 1510. The lower portion of the gate-conductor 150 is fabricated in operation 1512, and the lower portion of the gate-conductor 150 intersects the n-type active-region semiconductor structure 50*n*. As another non-limiting example, in the embodiments as shown in FIG. 8A and FIG. 8C, the gate-conductor 150*n* is fabricated in operation 1512 and the gate-conductor 150*n* intersects the n-type active-region semiconductor structure 50*n*.

In addition to operation 1512, another operation after operation 1510 is operation 1514. A second source conductive segment is fabricated in operation 1514 and the second source conductive segment intersects the second-type active-region semiconductor structure. As a non-limiting example, in the embodiments as shown in FIG. 1A and FIGS. 1C-1E, the conductive segment 132*n* is fabricated, and the conductive segment 132*n* (as a source conductive segment) intersects the n-type active-region semiconductor structure 50*n* and forms a source terminal of the NMOS transistor T1n. In the process flow of method 1500, both operation 1512 and operation 1514 are carried out after operation 1510. In some embodiments, operation 1512 is carried out before operation 1514. In some alternative embodiments, operation 1512 is carried out after operation 1514. After operations 1510, 1512, and 1514, the process flow proceeds to 1520.

In operation 1520 of method 1500, a layer of dielectric material is deposited and covers at least the second-type active-region semiconductor structure, and in operation 1530 of method 1500, a first-type active-region semiconductor structure is fabricated atop the layer of dielectric material. As a non-limiting example, in the embodiments as shown in FIG. 1A and FIGS. 1C-1E, the p-type active-region semiconductor structure 50*p* is fabricated atop the layer of dielectric material which is above the n-type active-region semiconductor structure 50*n*. Then, in operation 1532 of method 1500, a first gate-conductor is fabricated and intersects the first-type active-region semiconductor structure. As a non-limiting example, in the embodiments as shown in FIG. 1A and FIGS. 1C-1E, the upper portion of the gate-conductor 150 is fabricated, and the upper portion of the gate-conductor 150 intersects the p-type active-region semiconductor structure 50*p*.

In some embodiments, the lower portion and the upper portion of the gate-conductor 150 are fabricated separately in corresponding operations 1512 and 1532. In some embodiments, the integrated gate-conductor 150 is formed from the lower portion and the upper portion of the gate-conductor. Specifically, before the fabrication of the upper portion of the gate-conductor 150, a gate inter-connector passing through the layer of dielectric material above the n-type active-region semiconductor structure 50*n* is fabricated, and the gate inter-connector directly connects the lower portion of the gate-conductor 150 with the upper portion of the gate-conductor 150 to form the integrated gate-conductor 150. In some alternative embodiments, the first gate-conductor fabricated in operation 1532 and the second gate-conductor fabricated in operation 1512 are not directly connected with a gate inter-connector. For example, in the embodiments as shown in FIG. 8A and FIG. 8C, the gate-conductor 150*p* is fabricated in operation 1532 and the gate-conductor 150*n* is fabricated in operation 1512. The gate-conductor 150*p* and the gate-conductor 150*n* are not directly connected.

A first source conductive segment is fabricated in operation 1534 and the first source conductive segment intersects the first-type active-region semiconductor structure. As a non-limiting example, in the embodiments as shown in FIG. 1A and FIGS. 1C-1E, the conductive segment 132*p* is fabricated, and the conductive segment 132*p* (as a source conductive segment) intersects the p-type active-region semiconductor structure 50*p* and forms a source terminal of the PMOS transistor T1p. In the process flow of method 1500, both operation 1532 and operation 1534 are carried out after operation 1530. In some embodiments, operation 1532 is carried out before operation 1534. In some alternative embodiments, operation 1532 is carried out after operation 1534. After operations 1530, 1532, and 1534, the process flow proceeds to 1540.

In operation 1540 of method 1500, a first insulating material is deposited and covers the first gate-conductor and the first source conductive segment. After operation 1540, in operation 1550 of method 1500, a front-side metal layer is deposited over the first insulating material. Then, in operation 1555 of method 1500, the front-side metal layer is patterned to form a front-side power rail and a front-side signal line. The front-side power rail is conductively connected to the first source conductive segment through a first via-connector, and the front-side signal line is conductively connected to the first gate-conductor through a front-side gate via-connector. As a non-limiting example, in the embodiments as shown in FIG. 1A and FIGS. 1C-1E, the front-side power rail 30F and the front-side signal lines (120F and 140F) are fabricated in the front-side metal layer overlying the insulating material covering the gate-conductor 150 and the conductive segment 132*p*. The front-side power rail 30F is conductively connected to the conductive segment 132*p* through a top via-connector VT, and the front-side signal line 120F is conductively connected to the gate-conductor 150 through a top gate-via-connector VG.

After operations 1540, 1550, and 1555, the wafer containing the substrate is flipped in operation 1560. Then, the process flow proceeds to 1570. In operation 1570 of method 1500, a back-side metal layer is formed on a backside of the substrate. After operation 1570, in operation 1575 of method 1500, the back-side metal layer is patterned to form a back-side power rail and a back-side signal line. The back-side power rail is conductively connected to the second source conductive segment through a second via-connector, and the back-side signal line is conductively connected to the second gate-conductor through a backside gate via-connector. As a non-limiting example, in the embodiments as shown in FIG. 1A and FIGS. 1C-1E, the back-side power rail 30B and the back-side signal lines (120B and 140B) are fabricated in back-side metal layer at the backside of the substrate. The back-side power rail 30B is conductively connected to the conductive segment 132*n* through a bottom via-connector VB.

Figure 16:
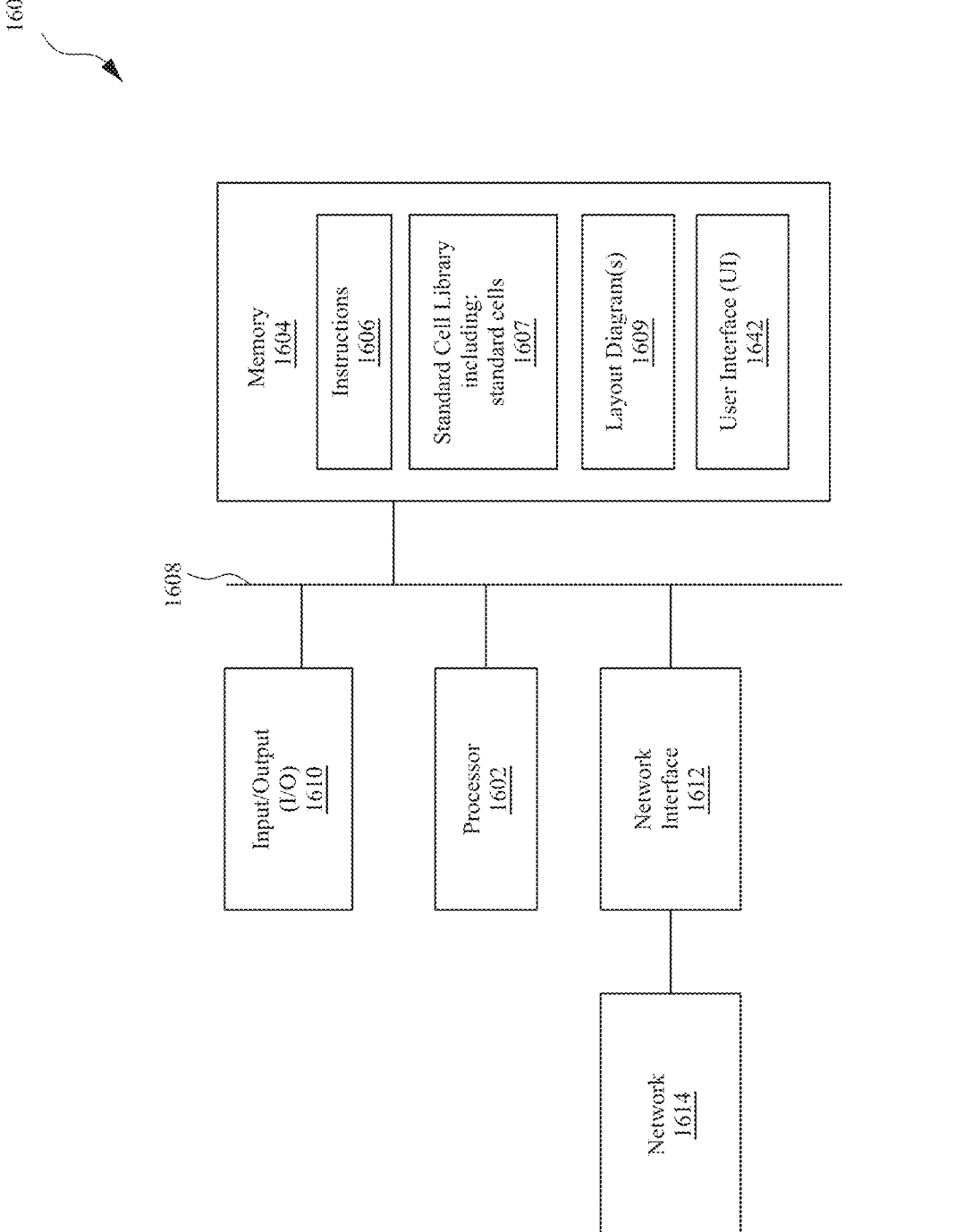
FIG. 16 is a block diagram of an electronic design automation (EDA) system in accordance with some embodiments.

FIG. 16 is a block diagram of an electronic design automation (EDA) system 1600 in accordance with some embodiments.

In some embodiments, EDA system 1600 includes an APR system. Methods described herein of designing layout diagrams represent wire routing arrangements, in accordance with one or more embodiments, are implementable, for example, using EDA system 1600, in accordance with some embodiments.

In some embodiments, EDA system 1600 is a general purpose computing device including a hardware processor 1602 and a non-transitory, computer-readable storage medium 1604. Storage medium 1604, amongst other things, is encoded with, i.e., stores, computer program code 1606, i.e., a set of executable instructions. Execution of instructions 1606 by hardware processor 1602 represents (at least in part) an EDA tool which implements a portion or all of the methods described herein in accordance with one or more embodiments (hereinafter, the noted processes and/or methods).

Processor 1602 is electrically coupled to computer-readable storage medium 1604 via a bus 1608. Processor 1602 is also electrically coupled to an I/0 interface 1610 by bus 1608. A network interface 1612 is also electrically connected to processor 1602 via bus 1608. Network interface 1612 is connected to a network 1614, so that processor 1602 and computer-readable storage medium 1604 are capable of connecting to external elements via network 1614. Processor 1602 is configured to execute computer program code 1606 encoded in computer-readable storage medium 1604 in order to cause system 1600 to be usable for performing a portion or all of the noted processes and/or methods. In one or more embodiments, processor 1602 is a central processing unit (CPU), a multi-processor, a distributed processing system, an application specific integrated circuit (ASIC), and/or a suitable processing unit.

In one or more embodiments, computer-readable storage medium 1604 is an electronic, magnetic, optical, electromagnetic, infrared, and/or a semiconductor system (or apparatus or device). For example, computer-readable storage medium 1604 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1604 includes a compact disk-read only memory (CD-ROM), a compact disk-read/write (CD-R/W), and/or a digital video disc (DVD).

In one or more embodiments, storage medium 1604 stores computer program code 1606 configured to cause system 1600 (where such execution represents (at least in part) the EDA tool) to be usable for performing a portion or all of the noted processes and/or methods. In one or more embodiments, storage medium 1604 also stores information which facilitates performing a portion or all of the noted processes and/or methods. In one or more embodiments, storage medium 1604 stores library 1607 of standard cells including such standard cells as disclosed herein. In one or more embodiments, storage medium 1604 stores one or more layout diagrams 1609 corresponding to one or more layouts disclosed herein.

EDA system 1600 includes I/O interface 1610. I/O interface 1610 is coupled to external circuitry. In one or more embodiments, I/O interface 1610 includes a keyboard, keypad, mouse, trackball, trackpad, touchscreen, and/or cursor direction keys for communicating information and commands to processor 1602.

EDA system 1600 also includes network interface 1612 coupled to processor 1602. Network interface 1612 allows system 1600 to communicate with network 1614, to which one or more other computer systems are connected. Network interface 1612 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 1600.

System 1600 is configured to receive information through I/O interface 1610. The information received through I/O interface 1610 includes one or more of instructions, data, design rules, libraries of standard cells, and/or other parameters for processing by processor 1602. The information is transferred to processor 1602 via bus 1608. EDA system 1600 is configured to receive information related to a UI through I/O interface 1610. The information is stored in computer-readable medium 1604 as user interface (UI) 1642.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1600. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 17:
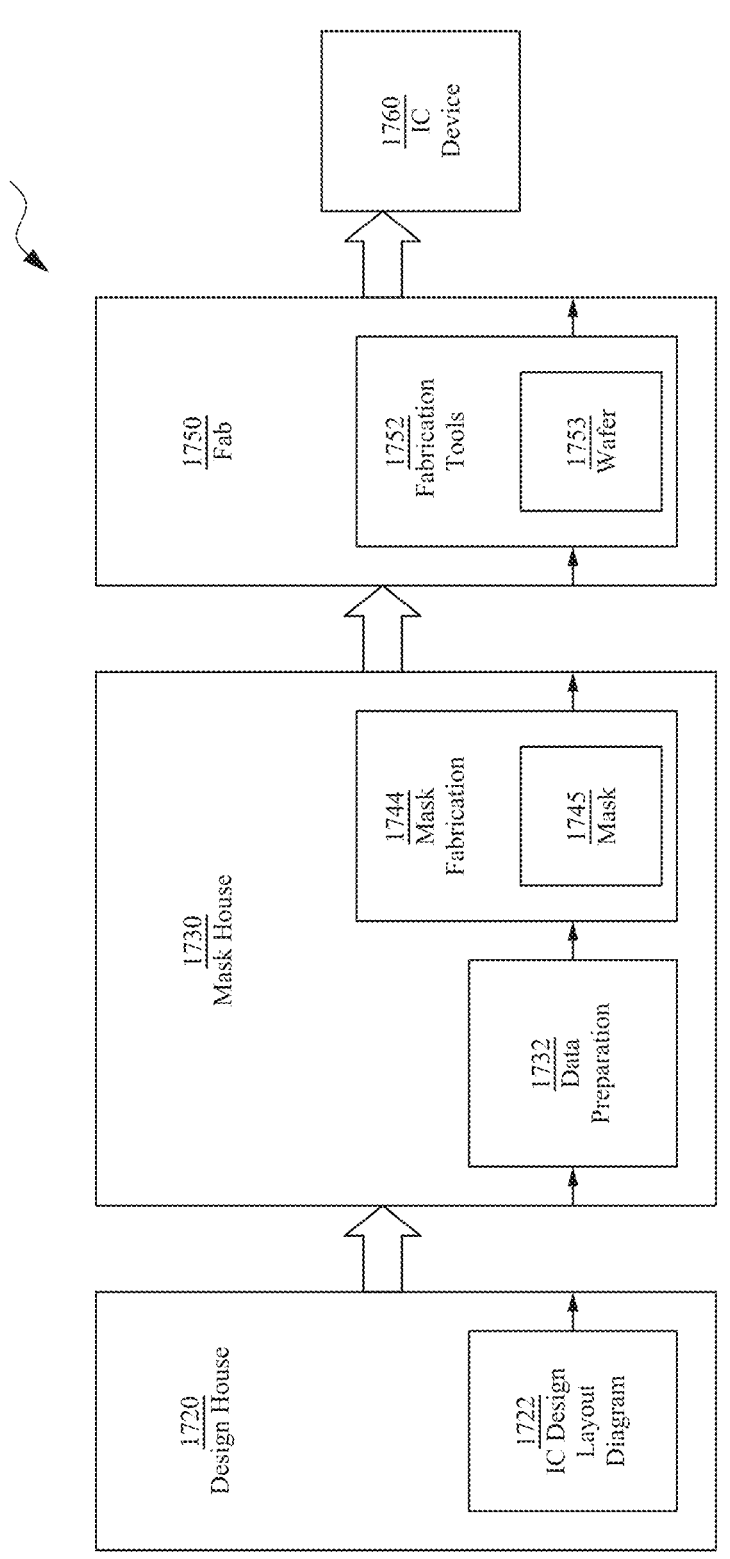
FIG. 17 is a block diagram of an integrated circuit (IC) manufacturing system, and an IC manufacturing flow associated therewith, in accordance with some embodiments.

FIG. 17 is a block diagram of an integrated circuit (IC) manufacturing system 1700, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 1700.

In FIG. 17, IC manufacturing system 1700 includes entities, such as a design house 1720, a mask house 1730, and an IC manufacturer/fabricator ("fab") 1750, that interact with one another in the design, development, and manufacturing cycles and/or services related to manufacturing an IC device 1760. The entities in system 1700 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1720, mask house 1730, and IC fab 1750 is owned by a single larger company. In some embodiments, two or more of design house 1720, mask house 1730, and IC fab 1750 coexist in a common facility and use common resources.

Design house (or design team) 1720 generates an IC design layout diagram 1722. IC design layout diagram 1722 includes various geometrical patterns designed for an IC device 1760. The geometrical patterns correspond to patterns of metal, oxide, or semiconductor layers that make up the various components of IC device 1760 to be fabricated. The various layers combine to form various IC features. For example, a portion of IC design layout diagram 1722 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1720 implements a proper design procedure to form IC design layout diagram 1722.

The design procedure includes one or more of logic design, physical design or place and route. IC design layout diagram 1722 is presented in one or more data files having information of the geometrical patterns. For example, IC design layout diagram 1722 can be expressed in a GDSII file format or DFII file format.

Mask house 1730 includes data preparation 1732 and mask fabrication 1744. Mask house 1730 uses IC design layout diagram 1722 to manufacture one or more masks 1745 to be used for fabricating the various layers of IC device 1760 according to IC design layout diagram 1722. Mask house 1730 performs mask data preparation 1732, where IC design layout diagram 1722 is translated into a representative data file ("RDF"). Mask data preparation 1732 provides the RDF to mask fabrication 1744. Mask fabrication 1744 includes a mask writer. A mask writer converts the RDF to an image on a substrate, such as a mask (reticle) 1745 or a semiconductor wafer 1753. The design layout diagram 1722 is manipulated by mask data preparation 1732 to comply with particular characteristics of the mask writer and/or requirements of IC fab 1750. In FIG. 17, mask data preparation 1732 and mask fabrication 1744 are illustrated as separate elements. In some embodiments, mask data preparation 1732 and mask fabrication 1744 can be collectively referred to as mask data preparation.

In some embodiments, mask data preparation 1732 includes optical proximity correction (OPC) which uses lithography enhancement techniques to compensate for image errors, such as those that can arise from diffraction, interference, other process effects and the like. OPC adjusts IC design layout diagram 1722. In some embodiments, mask data preparation 1732 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1732 includes a mask rule checker (MRC) that checks the IC design layout diagram 1722 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1722 to compensate for limitations during mask fabrication 1744, which may undo part of the modifications performed by OPC in order to meet mask creation rules.

In some embodiments, mask data preparation 1732 includes lithography process checking (LPC) that simulates processing that will be implemented by IC fab 1750 to fabricate IC device 1760. LPC simulates this processing based on IC design layout diagram 1722 to create a simulated manufactured device, such as IC device 1760. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus (DOF), mask error enhancement factor (MEEF), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1722.

It should be understood that the above description of mask data preparation 1732 has been simplified for the purposes of clarity. In some embodiments, data preparation 1732 includes additional features such as a logic operation (LOP) to modify the IC design layout diagram 1722 according to manufacturing rules. Additionally, the processes applied to IC design layout diagram 1722 during data preparation 1732 may be executed in a variety of different orders.

After mask data preparation 1732 and during mask fabrication 1744, a mask 1745 or a group of masks 1745 are fabricated based on the modified IC design layout diagram 1722. In some embodiments, mask fabrication 1744 includes performing one or more lithographic exposures based on IC design layout diagram 1722. In some embodiments, an electron-beam (e-beam) or a mechanism of multiple e-beams is used to form a pattern on a mask (photomask or reticle) 1745 based on the modified IC design layout diagram 1722. Mask 1745 can be formed in various technologies. In some embodiments, mask 1745 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1745 includes a transparent substrate (e.g., fused quartz) and an opaque material (e.g., chromium) coated in the opaque regions of the binary mask. In another example, mask 1745 is formed using a phase shift technology. In a phase shift mask (PSM) version of mask 1745, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1744 is used in a variety of processes. For example, such a mask(s) is used in an ion implantation process to form various doped regions in semiconductor wafer 1753, in an etching process to form various etching regions in semiconductor wafer 1753, and/or in other suitable processes.

IC fab 1750 is an IC fabrication business that includes one or more manufacturing facilities for the fabrication of a variety of different IC products. In some embodiments, IC Fab 1750 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1750 includes fabrication tools 1752 configured to execute various manufacturing operations on semiconductor wafer 1753 such that IC device 1760 is fabricated in accordance with the mask(s), e.g., mask 1745. In various embodiments, fabrication tools 1752 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1750 uses mask(s) 1745 fabricated by mask house 1730 to fabricate IC device 1760. Thus, IC fab 1750 at least indirectly uses IC design layout diagram 1722 to fabricate IC device 1760. In some embodiments, semiconductor wafer 1753 is fabricated by IC fab 1750 using mask(s) 1745 to form IC device 1760. In some embodiments, the IC fabrication includes performing one or more lithographic exposures based at least indirectly on IC design layout diagram 1722. Semiconductor wafer 1753 includes a silicon substrate or other proper substrate having material layers formed thereon. Semiconductor wafer 1753 further includes one or more of various doped regions, dielectric features, multilevel interconnects, and the like (formed at subsequent manufacturing steps).

Details regarding an integrated circuit (IC) manufacturing system (e.g., system 1700 of FIG. 17), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

An aspect of the present disclosure relates to an integrated circuit device. The integrated circuit device includes a first-type active-region semiconductor structure extending in a first direction, a first-type transistor having a channel region in the first-type active-region semiconductor structure, a second-type active-region semiconductor structure extending in the first direction and stacked with the first-type active-region semiconductor structure, and a second-type transistor having a channel region in the second-type active-region semiconductor structure. The integrated circuit device also includes a front-side power rail and a front-side signal line each extending in the first direction in a front-side conductive layer which is above the first-type active-region semiconductor structure and the second-type active-region semiconductor structure. The integrated circuit device further includes a back-side power rail and a back-side signal line each extending in the first direction in a back-side conductive layer which is below the first-type active-region semiconductor structure and the second-type active-region semiconductor structure. The front-side power rail is connected to a source terminal of the first-type transistor and is configured to maintain a first supply voltage. The back-side power rail is connected to a source terminal of the second-type transistor and is configured to maintain a second supply voltage, and wherein the back-side conductive layer is a single layer.

Another aspect of the present disclosure relates to an integrated circuit device. The integrated circuit device includes a first-type active-region semiconductor structure extending in a first direction, first-type transistors each having a channel region in the first-type active-region semiconductor structure, a second-type active-region semiconductor structure, extending in the first direction, stacked with the first-type active-region semiconductor structure, and second-type transistors each having a channel region in the second-type active-region semiconductor structure. The integrated circuit device also includes a front-side power rail extending in the first direction in a front-side conductive layer above the first-type active-region semiconductor structure and the second-type active-region semiconductor structure, and a front-side signal line extending in the first direction in the front-side conductive layer. The front-side power rail is configured to maintain a first supply voltage. The front-side signal line is configured to receive a first voltage change at a drain terminal of one of the first-type transistors. The integrated circuit device further includes a back-side power rail extending in the first direction in a back-side conductive layer below the first-type active-region semiconductor structure and the second-type active-region semiconductor structure, and a back-side signal line extending in the first direction in the back-side conductive layer. The back-side power rail is configured to maintain a second supply voltage. The back-side signal line is configured to receive a second voltage change at a drain terminal of one of the second-type transistors.

Another aspect of the present disclosure still relates to an integrated circuit device. The integrated circuit device includes a first-type active-region semiconductor structure extending in a first direction, and a second-type active-region semiconductor structure extending in the first direction and stacked with the first-type active-region semiconductor structure. The integrated circuit device also includes a front-side power rail and a front-side signal line each extending in the first direction in a front-side conductive layer which is above the first-type active-region semiconductor structure and the second-type active-region semiconductor structure. The integrated circuit device further includes a back-side power rail and a back-side signal line each extending in the first direction in a back-side conductive layer which is below the first-type active-region semiconductor structure and the second-type active-region semiconductor structure, wherein the back-side conductive layer is a single layer. The integrated circuit device still includes a first source conductive segment, extending in a second direction, intersecting the first-type active-region semiconductor structure at a source region of a first-type transistor, a first via-connector connected between the first source conductive segment and the front-side power rail. a second source conductive segment, extending in the second direction, intersecting the second-type active-region semiconductor structure at a source region of a second-type transistor, and a second via-connector connected between the second source conductive segment and the back-side power rail. The second direction is perpendicular to the first direction.

Aspects of the present disclosure relate to an integrated circuit device. The integrated circuit device includes a first-type active-region semiconductor structure extending in a first direction, and a first gate-conductor, extending in a second direction perpendicular to the first direction. The first gate-conductor intersects the first-type active-region semiconductor structure at a channel region of a first-type transistor. The integrated circuit device also includes a second-type active-region semiconductor structure extending in the first direction, and a second gate-conductor extending in the second direction which intersects the second-type active-region semiconductor structure at a channel region of a second-type transistor. The second-type active-region semiconductor structure stacks with the first-type active-region semiconductor structure and is shifted from the first-type active-region semiconductor structure along a third direction that is perpendicular to both the first direction and the second direction. The integrated circuit device also includes a front-side conductive layer and a back-side conductive layer. The front-side conductive layer is oriented toward the third direction and positioned above the first-type active-region semiconductor structure and the second-type active-region semiconductor structure. The back-side conductive layer is oriented toward the third direction and positioned below the first-type active-region semiconductor structure and the second-type active-region semiconductor structure. The integrated circuit device also includes a front-side power rail, a back-side power rail, a front-side signal line, and a back-side signal line. The front-side power rail extends in the first direction in the front-side conductive layer and is configured to maintain a first supply voltage. The back-side power rail extends in the first direction in the back-side conductive layer and is configured to maintain a second supply voltage. The front-side signal line extends in the first direction in the front-side conductive layer. The back-side signal line extends in the first direction in the back-side conductive layer. The integrated circuit device also includes a first source conductive segment, a second source conductive segment, and a drain conductive segment. The first source conductive segment extends in the second direction and intersects the first-type active-region semiconductor structure at a source region of the first-type transistor, and the first source conductive segment is conductively connected to the front-side power rail through a first via-connector. The second source conductive segment extends in the second direction and intersects the second-type active-region semiconductor structure at a source region of the second-type transistor, and conductively connected to the back-side power rail through a second via-connector. The drain conductive segment extends in the second direction and intersects one or both of the first-type active-region semiconductor structure and the second-type active-region semiconductor structure, and conductively connected to the front-side signal line or the back-side signal line through a third via-connector.

Another aspect of the present disclosure relate to an integrated circuit device. The integrated circuit device includes a first-type active-region semiconductor structure, a second-type active-region semiconductor structure, a front-side conductive layer, a back-side conductive layer, a plurality of gate-conductors, a plurality of conductive segments, a front-side signal line, and a back-side power rail. The first-type active-region semiconductor structure extends in a first direction. The second-type active-region semiconductor structure extending in the first direction is stacked with the first-type active-region semiconductor structure. The front-side conductive layer is above the first-type active-region semiconductor structure and the second-type active-region semiconductor structure. The back-side conductive layer is below the first-type active-region semiconductor structure and the second-type active-region semiconductor structure. The plurality of gate-conductors extends in a second direction perpendicular to the first direction. Each of the gate-conductors intersects one or both of the first-type active-region semiconductor structure and the second-type active-region semiconductor structure while forming a gate terminal of at least one transistor. The plurality of conductive segments extends in the second direction. Each of the conductive segments intersecting one or both of the first-type active-region semiconductor structure and the second-type active-region semiconductor structure while forming a source terminal or a drain terminal of at least one transistor. The plurality of conductive segments includes a first conductive segment, a second conductive segment, a third conductive segment intersecting the first-type active-region semiconductor structure, and a fourth conductive segment intersecting the second-type active-region semiconductor structure. The front-side signal line extends in the first direction in the front-side conductive layer and is configured to transmit a first voltage change at the first conductive segment to one or more of the gate-conductors or to one or more of the conductive segments. The back-side signal line extends in the first direction in the back-side conductive layer and is configured to transmit a second voltage change at the second conductive segment to one or more of the gate-conductors or to one or more of the conductive segments. The front-side power rail extends in the first direction in the front-side conductive layer and is configured to maintain a first supply voltage, and conductively connected to the third conductive segment through a first via-connector. The back-side power rail extends in the first direction in the back-side conductive layer and is configured to maintain a second supply voltage, and conductively connected to the fourth conductive segment through a second via-connector.

Still another aspect of the present disclosure relate to a method. The method includes fabricating a first-type active-region semiconductor structure extending in a first direction on a substrate, fabricating a first gate-conductor intersecting the first-type active-region semiconductor structure at a channel region of a first first-type transistor, and fabricating a first source conductive segment intersecting the first-type active-region semiconductor structure at a first source region. The method includes depositing a layer of dielectric material covering at least the first-type active-region semiconductor structure and fabricating a second-type active-region semiconductor structure extending in the first direction atop the layer of dielectric material. The second-type active-region semiconductor structure is stacked with the first-type active-region semiconductor structure. The method includes fabricating a second gate-conductor intersecting the second-type active-region semiconductor structure at a channel region of a first second-type transistor, and fabricating a second source conductive segment intersecting the second-type active-region semiconductor structure at a second source region. The method includes depositing a first insulating material covering the second gate-conductor and the second source conductive segment, depositing a front-side metal layer over the first insulating material, and patterning the front-side metal layer to form a front-side power rail extending in the first direction and a front-side signal line extending in the first direction. The front-side power rail is conductively connected to the second source conductive segment through a first via-connector, and wherein the front-side signal line is conductively connected to the second gate-conductor through a front-side gate via-connector. The method includes forming a back-side metal layer on a backside of the substrate and patterning the back-side metal layer to form a back-side power rail extending in the first direction and a back-side signal line extending in the first direction. The back-side power rail is conductively connected to the first source conductive segment through a second via-connector.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. An integrated circuit device comprising:
   a substrate;
   a first-type active-region semiconductor structure extending in a first direction at a front side of the substrate;
   a first-type transistor having a channel region in the first-type active-region semiconductor structure;
   a second-type active-region semiconductor structure extending in the first direction at the front side of the substrate and stacked with the first-type active-region semiconductor structure;
   a second-type transistor having a channel region in the second-type active-region semiconductor structure, wherein the first-type transistor and the second-type transistor are stacked over one another and form one complementary pair of transistors;

a front-side power rail and a front-side signal line each extending in the first direction in a front-side conductive layer which is above the first-type active-region semiconductor structure and the second-type active-region semiconductor structure, wherein the front-side power rail is connected to a source terminal of the first-type transistor in the one complementary pair of transistors and is configured to maintain a first supply voltage; and a back-side power rail and a back-side signal line each extending in the first direction in a back-side conductive layer at a back side of the substrate, wherein the front-side power rail and the back-side power rail overlap each other when viewed in a direction that is normal to the front-side conductive layer and the back-side conductive layer, wherein the back-side power rail is connected to a source terminal of the second-type transistor in the one complementary pair of transistors and is configured to maintain a second supply voltage, and wherein the back-side conductive layer is a single layer, wherein the back-side signal line is either configured to receive a voltage change at a drain terminal of the second-type transistor or configured to apply a voltage change to a gate terminal of the second-type transistor, and wherein the back-side signal line and the back-side power rail are in a same conductive layer.

2. The integrated circuit device of claim 1, further comprising:

a first gate-conductor, extending in a second direction perpendicular to the first direction, intersecting the first-type active-region semiconductor structure at the channel region of the first-type transistor.

3. The integrated circuit device of claim 2, further comprising:

a first source conductive segment, extending in the second direction, intersecting the first-type active-region semiconductor structure at a source region of the first-type transistor, and conductively connected to the front-side power rail through a first via-connector.

4. The integrated circuit device of claim 1, wherein the front-side power rail and the back-side power rail are aligned with each other along boundaries when viewed in a direction that is normal to the front-side conductive layer and the back-side conductive layer.

5. The integrated circuit device of claim 1, wherein each of the first-type active-region semiconductor structure and the second-type active-region semiconductor structure includes at least one nano-sheet.

6. The integrated circuit device of claim 1, wherein each of the first-type active-region semiconductor structure and the second-type active-region semiconductor structure includes at least one nano-wire.

7. An integrated circuit device comprising:

a substrate;

a first-type active-region semiconductor structure extending in a first direction at a front side of the substrate;

first-type transistors each having a channel region in the first-type active-region semiconductor structure;

a second-type active-region semiconductor structure, extending in the first direction at the front side of the substrate, stacked with the first-type active-region semiconductor structure;

second-type transistors each having a channel region in the second-type active-region semiconductor structure, wherein a first-type transistor and a second-type transistor are stacked over one another and form one complementary pair of transistors;

a front-side power rail extending in the first direction in a front-side conductive layer above the first-type active-region semiconductor structure and the second-type active-region semiconductor structure, wherein the front-side power rail is connected to a source terminal of the first-type transistor in the one complementary pair of transistors;

a front-side signal line extending in the first direction in the front-side conductive layer, wherein the front-side signal line is configured to receive a first voltage change at a drain terminal of one of the first-type transistors;

a back-side power rail extending in the first direction in a back-side conductive layer at a back side of the substrate, wherein the front-side power rail and the back-side power rail overlaps with each other when viewed in a direction that is normal to the front-side conductive layer and the back-side conductive layer, and wherein the back-side power rail is connected to a source terminal of the second-type transistor in the one complementary pair of transistors; and a back-side signal line extending in the first direction in the back-side conductive layer, wherein the back-side signal line is configured to receive a second voltage change at a drain terminal of one of the second-type transistors, and wherein the back-side signal line and the back-side power rail are in a same conductive layer.

8. The integrated circuit device of claim 7, wherein the front-side power rail and the back-side power rail are aligned with each other along boundaries when viewed in a direction that is normal to the front-side conductive layer and the back-side conductive layer.

9. The integrated circuit device of claim 7, wherein the first-type active-region semiconductor structure is underneath the second-type active-region semiconductor structure.

10. The integrated circuit device of claim 7, wherein each of the first-type active-region semiconductor structure and the second-type active-region semiconductor structure includes at least one nano-sheet.

11. The integrated circuit device of claim 7, wherein each of the first-type active-region semiconductor structure and the second-type active-region semiconductor structure includes at least one nano-wire.

12. An integrated circuit device comprising:

a substrate;

a first-type active-region semiconductor structure extending in a first direction at a front side of the substrate;

a second-type active-region semiconductor structure extending in the first direction at the front side of the substrate and stacked with the first-type active-region semiconductor structure;

a first source conductive segment, extending in a second direction, intersecting the first-type active-region semiconductor structure at a source region of a first-type transistor, wherein the second direction is perpendicular to the first direction;

a second source conductive segment, extending in the second direction, intersecting the second-type active-region semiconductor structure at a source region of a second-type transistor, wherein the first-type transistor and the second-type transistor are stacked over one another and form one complementary pair of transistors;

a front-side power rail and a front-side signal line each extending in the first direction in a front-side conductive layer which is above the first-type active-region semiconductor structure and the second-type active-region semiconductor structure; and a back-side power rail and a back-side signal line each extending in the first direction in a back-side conductive layer at a back side of the substrate, wherein the front-side power rail and the back-side power rail overlap each other when viewed in a direction that is normal to the front-side conductive layer and the back-side conductive layer, wherein the back-side conductive layer is a single layer, wherein the back-side signal line is either configured to receive a voltage change at a drain terminal of the second-type transistor or configured to apply a voltage change to a gate terminal of the second-type transistor, and wherein the back-side signal line and the back-side power rail are in a same conductive layer;

a first via-connector connected between the front-side power rail and the first source conductive segment which is connected to the source region of the first-type transistor in the one complementary pair of transistors; and a second via-connector connected between the back-side power rail and the second source conductive segment which is connected to the source region of the second-type transistor in the one complementary pair of transistors.

13. The integrated circuit device of claim 12, further comprising:

a first gate-conductor, extending in the second direction perpendicular to the first direction, intersecting the first-type active-region semiconductor structure at a channel region of the first-type transistor.

14. The integrated circuit device of claim 13, further comprising:

a drain conductive segment, extending in the second direction, intersecting ene or both of the first-type active-region semiconductor structure.

15. The integrated circuit device of claim 12, wherein the front-side power rail and the back-side power rail are aligned with each other along boundaries when viewed in a direction that is normal to the front-side conductive layer and the back-side conductive layer.

16. The integrated circuit device of claim 12, wherein each of the first-type active-region semiconductor structure and the second-type active-region semiconductor structure includes at least one nano-sheet.

17. The integrated circuit device of claim 12, wherein each of the first-type active-region semiconductor structure and the second-type active-region semiconductor structure includes at least one nano-wire.

18. The integrated circuit device of claim 2, further comprising:

a second gate-conductor, extending in the second direction, intersecting the second-type active-region semiconductor structure at the channel region of the second-type transistor.

19. The integrated circuit device of claim 18, further comprising:

a second source conductive segment, extending in the second direction, intersecting the second-type active-region semiconductor structure at a source region of the second-type transistor, and conductively connected to the back-side power rail through a second via-connector.

20. The integrated circuit device of claim 13, further comprising:

a second gate-conductor, extending in the second direction, intersecting the second-type active-region semiconductor structure at a channel region of the second-type transistor; and a drain conductive segment, extending in the second direction, intersecting one or both of the first-type active-region semiconductor structure and the second-type active-region semiconductor structure, and conductively connected to the front-side signal line or the back-side signal line through a third via-connector.

* * * * *